United States Patent
Rotzoll et al.

(10) Patent No.: US 10,832,609 B2
(45) Date of Patent: Nov. 10, 2020

(54) DIGITAL-DRIVE PULSE-WIDTH-MODULATED OUTPUT SYSTEM

(71) Applicant: X Display Company Technology Limited, Dublin (IE)

(72) Inventors: Robert R. Rotzoll, Colorado Springs, CO (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 10 days.

(21) Appl. No.: 15/416,678

(22) Filed: Jan. 26, 2017

(65) Prior Publication Data

US 2018/0197471 A1    Jul. 12, 2018

Related U.S. Application Data

(60) Provisional application No. 62/444,753, filed on Jan. 10, 2017.

(51) Int. Cl.
```
H01L 25/16      (2006.01)
H01L 25/075     (2006.01)
G09G 3/20       (2006.01)
```
(52) U.S. Cl.
CPC .......... *G09G 3/2003* (2013.01); *G09G 3/2007* (2013.01); *G09G 3/2085* (2013.01);
(Continued)

(58) Field of Classification Search
CPC ........... G09G 2230/00; G09G 2310/02; G09G 2310/027; G09G 3/2014; G09G 3/2085;
(Continued)

(56) References Cited

U.S. PATENT DOCUMENTS

| 5,550,066 A | 8/1996 | Tang et al. |
| 5,621,555 A | 4/1997 | Park |
(Continued)

FOREIGN PATENT DOCUMENTS

| GB | 2 496 183 A | 5/2013 |
| WO | WO-2006/027730 A1 | 3/2006 |
(Continued)

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).
(Continued)

*Primary Examiner* — Patrick N Edouard
*Assistant Examiner* — Douglas M Wilson
(74) *Attorney, Agent, or Firm* — William R. Haulbrook; Michael D. Schmitt; Choate, Hall & Stewart LLP

(57) ABSTRACT

An active-matrix digital-drive display system includes an array of pixels. Each pixel has an output device, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the output device during an uninterrupted output time period. A controller external to the array of pixels provides to each pixel the load timing signal and the multi-bit digital pixel value during the load time period and the PWM timing signal during the output time period. The PWM timing signal has multiple different PWM time periods that are sequentially provided at different times to the pixels. Each PWM time period has a different temporal length corresponding to a bit of the multi-bit digital pixel value.

21 Claims, 13 Drawing Sheets

(52) U.S. Cl.
CPC ........ *H01L 25/0753* (2013.01); *H01L 25/167* (2013.01); *G09G 2300/0426* (2013.01); *G09G 2300/0452* (2013.01); *G09G 2300/0857* (2013.01); *G09G 2310/08* (2013.01); *G09G 2320/064* (2013.01)

(58) Field of Classification Search
CPC .... G09G 3/2029; G09G 3/2037; G09G 3/206; G09G 2310/08; G09G 2300/0857; G09G 2320/064; G09G 3/3208; G09G 2320/0247; G09G 3/2018; G09G 3/2033; H01L 2924/14–15; H01L 2224/2744; H01L 2224/1144; H01L 2224/0344; H01L 25/167; H01L 27/1214; H01L 33/48; H01L 33/486; H01L 27/156; H01L 27/3293; H01L 24/97; H01L 24/83; G02F 1/13336; B41K 3/12; B41K 3/04
See application file for complete search history.

(56) References Cited

U.S. PATENT DOCUMENTS

| | | | |
|---|---|---|---|
| 5,731,802 A * | 3/1998 | Aras | G09G 3/2022 345/692 |
| 5,815,303 A | 9/1998 | Berlin | |
| 5,912,712 A | 6/1999 | Doherty | |
| 5,994,722 A | 11/1999 | Averbeck et al. | |
| 6,084,579 A | 7/2000 | Hirano | |
| 6,142,358 A | 11/2000 | Cohn et al. | |
| 6,184,477 B1 | 2/2001 | Tanahashi | |
| 6,278,242 B1 | 8/2001 | Cok et al. | |
| 6,392,340 B2 | 5/2002 | Yoneda et al. | |
| 6,441,829 B1 * | 8/2002 | Blalock | G09G 3/3651 341/141 |
| 6,448,718 B1 | 9/2002 | Battersby | |
| 6,466,281 B1 | 10/2002 | Huang et al. | |
| 6,577,367 B2 | 6/2003 | Kim | |
| 6,660,457 B1 | 12/2003 | Imai et al. | |
| 6,717,560 B2 | 4/2004 | Cok et al. | |
| 6,756,576 B1 | 6/2004 | McElroy et al. | |
| 6,812,637 B2 | 11/2004 | Cok et al. | |
| 6,933,532 B2 | 8/2005 | Arnold et al. | |
| 7,012,382 B2 | 3/2006 | Cheang et al. | |
| 7,091,523 B2 | 8/2006 | Cok et al. | |
| 7,129,457 B2 | 10/2006 | McElroy et al. | |
| 7,195,733 B2 | 3/2007 | Rogers et al. | |
| 7,288,753 B2 | 10/2007 | Cok | |
| 7,402,951 B2 | 7/2008 | Cok | |
| 7,420,221 B2 | 9/2008 | Nagai | |
| 7,443,438 B2 | 10/2008 | Kakumoto et al. | |
| 7,466,075 B2 | 12/2008 | Cok et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,622,367 B1 * | 11/2009 | Nuzzo | H01L 27/1285 438/472 |
| 7,662,545 B2 | 2/2010 | Nuzzo et al. | |
| 7,687,812 B2 | 3/2010 | Louwsma et al. | |
| 7,704,684 B2 | 4/2010 | Rogers et al. | |
| 7,738,001 B2 * | 6/2010 | Routley | G09G 3/3216 345/691 |
| 7,791,271 B2 | 9/2010 | Cok et al. | |
| 7,799,699 B2 | 9/2010 | Nuzzo et al. | |
| 7,816,856 B2 | 10/2010 | Cok et al. | |
| 7,834,541 B2 | 11/2010 | Cok | |
| 7,893,612 B2 | 2/2011 | Cok | |
| 7,919,342 B2 | 4/2011 | Cok | |
| 7,927,976 B2 | 4/2011 | Menard | |
| 7,932,123 B2 * | 4/2011 | Rogers | H01L 29/155 438/73 |
| 7,943,491 B2 | 5/2011 | Nuzzo et al. | |
| 7,969,085 B2 | 6/2011 | Cok | |
| 7,972,875 B2 | 7/2011 | Rogers et al. | |
| 7,982,296 B2 | 7/2011 | Nuzzo et al. | |
| 7,990,058 B2 | 8/2011 | Cok et al. | |
| 7,999,454 B2 | 8/2011 | Winters et al. | |
| 8,029,139 B2 | 10/2011 | Ellinger et al. | |
| 8,039,847 B2 | 10/2011 | Nuzzo et al. | |
| 8,115,380 B2 * | 2/2012 | Cok | H01L 27/3255 313/505 |
| 8,198,621 B2 | 6/2012 | Rogers et al. | |
| 8,207,547 B2 | 6/2012 | Lin | |
| 8,207,635 B2 | 6/2012 | Covaro | |
| 8,243,027 B2 | 8/2012 | Hotelling et al. | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,421,791 B2 | 4/2013 | Harada | |
| 8,440,546 B2 | 5/2013 | Nuzzo et al. | |
| 8,450,927 B2 | 5/2013 | Lenk et al. | |
| 8,470,701 B2 | 6/2013 | Rogers et al. | |
| 8,502,192 B2 | 8/2013 | Kwak et al. | |
| 8,506,867 B2 * | 8/2013 | Menard | H01L 24/97 264/293 |
| 8,558,243 B2 | 10/2013 | Bibl et al. | |
| 8,664,699 B2 | 3/2014 | Nuzzo et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 * | 8/2014 | Cok | G09G 3/3208 345/204 |
| 8,817,369 B2 | 8/2014 | Daiku | |
| 8,854,294 B2 | 10/2014 | Sakariya | |
| 8,877,648 B2 | 11/2014 | Bower et al. | |
| 8,889,485 B2 | 11/2014 | Bower | |
| 8,895,406 B2 | 11/2014 | Rogers et al. | |
| 8,941,215 B2 | 1/2015 | Hu et al. | |
| 8,987,765 B2 | 3/2015 | Bibl et al. | |
| 9,105,714 B2 | 8/2015 | Hu et al. | |
| 9,111,464 B2 | 8/2015 | Bibl et al. | |
| 9,139,425 B2 | 9/2015 | Vestyck | |
| 9,153,171 B2 | 10/2015 | Sakariya et al. | |
| 9,161,448 B2 | 10/2015 | Menard et al. | |
| 9,166,114 B2 | 10/2015 | Hu et al. | |
| 9,178,123 B2 | 11/2015 | Sakariya et al. | |
| 9,202,996 B2 | 12/2015 | Orsley et al. | |
| 9,217,541 B2 | 12/2015 | Bathurst et al. | |
| 9,358,775 B2 | 6/2016 | Bower et al. | |
| 9,478,583 B2 | 10/2016 | Hu et al. | |
| 9,484,504 B2 | 11/2016 | Bibl et al. | |
| 9,520,537 B2 | 12/2016 | Bower et al. | |
| 9,555,644 B2 | 1/2017 | Rogers et al. | |
| 9,570,532 B2 | 2/2017 | Huangfu et al. | |
| 9,601,356 B2 | 3/2017 | Bower et al. | |
| 9,626,908 B2 | 4/2017 | Sakariya et al. | |
| 9,640,108 B2 | 5/2017 | Cok et al. | |
| 9,640,715 B2 | 5/2017 | Bower et al. | |
| 9,660,008 B2 * | 5/2017 | Bower | H01L 27/3255 |
| 9,716,082 B2 | 7/2017 | Bower et al. | |
| 9,761,754 B2 | 9/2017 | Bower et al. | |
| 9,765,934 B2 | 9/2017 | Rogers et al. | |
| 9,786,646 B2 | 10/2017 | Cok et al. | |
| 9,818,725 B2 | 11/2017 | Bower et al. | |
| 9,865,832 B2 | 1/2018 | Bibl et al. | |
| 9,905,159 B2 * | 2/2018 | Genoe | G09G 3/2003 |
| 9,923,133 B2 | 3/2018 | Bower et al. | |
| 9,928,771 B2 | 3/2018 | Cok | |
| 9,929,053 B2 | 3/2018 | Bower et al. | |
| 9,930,277 B2 | 3/2018 | Cok | |
| 9,959,815 B2 * | 5/2018 | Sakariya | G09G 3/32 |
| 10,157,153 B2 | 12/2018 | Shacham et al. | |
| 10,157,563 B2 | 12/2018 | Cok et al. | |
| 10,158,819 B2 | 12/2018 | Cok | |
| 10,388,205 B2 | 8/2019 | Cok et al. | |
| 2001/0022564 A1 | 9/2001 | Youngquist et al. | |
| 2002/0078559 A1 * | 6/2002 | Buchwalter | G02F 1/1362 29/832 |
| 2002/0096994 A1 | 7/2002 | Iwafuchi et al. | |

(56) References Cited

U.S. PATENT DOCUMENTS

| | | | |
|---|---|---|---|
| 2002/0154101 A1* | 10/2002 | Abe | G09G 3/22 345/204 |
| 2003/0062545 A1 | 4/2003 | Yamazaki et al. | |
| 2003/0117369 A1 | 6/2003 | Spitzer et al. | |
| 2003/0141570 A1 | 7/2003 | Chen et al. | |
| 2003/0189829 A1 | 10/2003 | Shimizu et al. | |
| 2003/0223275 A1 | 12/2003 | Abe | |
| 2004/0140763 A1* | 7/2004 | Buchwalter | G02F 1/1362 313/506 |
| 2004/0212296 A1 | 10/2004 | Nakamura et al. | |
| 2004/0227704 A1 | 11/2004 | Wang et al. | |
| 2004/0252933 A1 | 12/2004 | Sylvester et al. | |
| 2005/0012076 A1 | 1/2005 | Morioka | |
| 2005/0040754 A1* | 2/2005 | Sakurai | H01L 27/3253 313/500 |
| 2005/0104833 A1* | 5/2005 | Ochi | G09G 3/3651 345/96 |
| 2005/0116621 A1 | 6/2005 | Bellmann et al. | |
| 2005/0140275 A1 | 6/2005 | Park | |
| 2005/0168987 A1 | 8/2005 | Tamaoki et al. | |
| 2005/0253159 A1 | 11/2005 | Creswick et al. | |
| 2005/0275615 A1 | 12/2005 | Kahen et al. | |
| 2006/0063309 A1 | 3/2006 | Sugiyama et al. | |
| 2006/0170623 A1* | 8/2006 | Naugler, Jr. | G09G 3/2081 345/76 |
| 2007/0035340 A1 | 2/2007 | Kimura | |
| 2007/0077349 A1* | 4/2007 | Newman | B82Y 20/00 427/66 |
| 2007/0132674 A1* | 6/2007 | Tsuge | G09G 3/3283 345/77 |
| 2007/0201056 A1 | 8/2007 | Cok et al. | |
| 2007/0216610 A1 | 9/2007 | Smith | |
| 2007/0252856 A1* | 11/2007 | Hudson | G09G 3/2025 345/693 |
| 2008/0174515 A1* | 7/2008 | Matthies | H01L 27/3293 345/1.3 |
| 2008/0180381 A1* | 7/2008 | Jeong | G09G 3/342 345/99 |
| 2008/0259019 A1 | 10/2008 | Ng | |
| 2009/0147033 A1 | 6/2009 | Arai et al. | |
| 2009/0273303 A1 | 11/2009 | Peng | |
| 2009/0289559 A1* | 11/2009 | Tanaka | H05B 45/46 315/185 R |
| 2009/0315054 A1 | 12/2009 | Kim et al. | |
| 2010/0039030 A1* | 2/2010 | Winters | H01L 27/3248 313/505 |
| 2010/0045690 A1 | 2/2010 | Handschy et al. | |
| 2010/0078670 A1 | 4/2010 | Kim et al. | |
| 2010/0085295 A1* | 4/2010 | Zhao | G09G 3/3406 345/102 |
| 2010/0123268 A1 | 5/2010 | Menard | |
| 2010/0156766 A1* | 6/2010 | Levey | G09G 3/3233 345/78 |
| 2010/0207848 A1* | 8/2010 | Cok | G09G 3/3208 345/76 |
| 2010/0207852 A1* | 8/2010 | Cok | H01L 27/3213 345/83 |
| 2010/0214247 A1 | 8/2010 | Tang et al. | |
| 2010/0248484 A1* | 9/2010 | Bower | H01L 21/76834 438/700 |
| 2010/0258710 A1 | 10/2010 | Wiese et al. | |
| 2010/0306993 A1 | 12/2010 | Mayyas et al. | |
| 2010/0317132 A1* | 12/2010 | Rogers | H01L 33/486 438/27 |
| 2011/0057861 A1* | 3/2011 | Cok | H01L 51/5209 345/1.3 |
| 2011/0084993 A1* | 4/2011 | Kawabe | G09G 3/3233 345/691 |
| 2011/0199011 A1 | 8/2011 | Nakazawa | |
| 2011/0211348 A1 | 9/2011 | Kim | |
| 2012/0126229 A1* | 5/2012 | Bower | H01L 24/83 257/48 |
| 2012/0206421 A1* | 8/2012 | Cok | G09G 3/2085 345/204 |
| 2012/0206499 A1* | 8/2012 | Cok | G09G 3/3208 345/690 |
| 2012/0228669 A1* | 9/2012 | Bower | H01L 27/3255 257/103 |
| 2012/0307123 A1* | 12/2012 | Cok | H01L 27/14603 348/333.01 |
| 2012/0314388 A1* | 12/2012 | Bower | H01L 24/83 361/760 |
| 2013/0015483 A1 | 1/2013 | Shimokawa et al. | |
| 2013/0069275 A1 | 3/2013 | Menard et al. | |
| 2013/0088416 A1 | 4/2013 | Smith et al. | |
| 2013/0141469 A1* | 6/2013 | Xu | G09G 3/3233 345/690 |
| 2013/0153277 A1* | 6/2013 | Menard | H05K 1/18 174/260 |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1* | 10/2013 | Menard | H01L 23/3142 438/118 |
| 2013/0316487 A1 | 11/2013 | de Graff et al. | |
| 2014/0055654 A1 | 2/2014 | Borthakur et al. | |
| 2014/0104243 A1* | 4/2014 | Sakariya | G06F 3/14 345/204 |
| 2014/0159043 A1 | 6/2014 | Sakariya et al. | |
| 2014/0184667 A1* | 7/2014 | Xu | G09G 3/3225 345/692 |
| 2014/0217448 A1 | 8/2014 | Kim et al. | |
| 2014/0264763 A1 | 9/2014 | Meitl et al. | |
| 2014/0267683 A1 | 9/2014 | Bibl et al. | |
| 2014/0306248 A1 | 10/2014 | Ahn et al. | |
| 2014/0367633 A1 | 12/2014 | Bibl et al. | |
| 2014/0367705 A1 | 12/2014 | Bibl et al. | |
| 2015/0028362 A1 | 1/2015 | Chan et al. | |
| 2015/0135525 A1 | 5/2015 | Bower | |
| 2015/0137153 A1 | 5/2015 | Bibl et al. | |
| 2015/0169011 A1 | 6/2015 | Bibl et al. | |
| 2015/0181148 A1 | 6/2015 | Slovick et al. | |
| 2015/0263066 A1 | 9/2015 | Hu et al. | |
| 2015/0280066 A1 | 10/2015 | Fujimura et al. | |
| 2015/0280089 A1 | 10/2015 | Obata et al. | |
| 2015/0302795 A1* | 10/2015 | Genoe | G09G 3/3233 345/691 |
| 2015/0362165 A1 | 12/2015 | Chu et al. | |
| 2015/0371585 A1* | 12/2015 | Bower | H05K 1/09 345/1.1 |
| 2015/0371591 A1* | 12/2015 | Suzuki | G09G 3/3291 345/208 |
| 2015/0371974 A1* | 12/2015 | Bower | H01L 23/4821 257/88 |
| 2015/0372051 A1* | 12/2015 | Bower | G09G 3/32 257/89 |
| 2015/0372052 A1* | 12/2015 | Bower | H01L 33/48 257/88 |
| 2015/0372053 A1* | 12/2015 | Bower | H01L 23/4821 257/89 |
| 2015/0373793 A1* | 12/2015 | Bower | G09G 3/32 362/20 |
| 2016/0005721 A1 | 1/2016 | Bower et al. | |
| 2016/0018094 A1 | 1/2016 | Bower et al. | |
| 2016/0064363 A1 | 3/2016 | Bower et al. | |
| 2016/0093600 A1 | 3/2016 | Bower et al. | |
| 2016/0118026 A1 | 4/2016 | Loo et al. | |
| 2016/0119565 A1* | 4/2016 | Fujita | H04N 5/3742 348/301 |
| 2016/0127668 A1* | 5/2016 | Fujita | H01L 27/14661 348/308 |
| 2016/0163253 A1* | 6/2016 | Chaji | G09G 3/3233 345/691 |
| 2016/0212361 A1* | 7/2016 | Suzuki | H04N 5/379 |
| 2016/0276326 A1* | 9/2016 | Natarajan | H01L 31/18 |
| 2016/0343771 A1 | 11/2016 | Bower et al. | |
| 2017/0040371 A1* | 2/2017 | Izuhara | H01L 27/1464 |
| 2017/0047393 A1 | 2/2017 | Bower et al. | |
| 2017/0061867 A1 | 3/2017 | Cok et al. | |

(56) References Cited

U.S. PATENT DOCUMENTS

| | | | |
|---|---|---|---|
| 2017/0084671 | A1 | 3/2017 | Hack et al. |
| 2017/0154819 | A1 | 6/2017 | Bower et al. |
| 2017/0186356 | A1 | 6/2017 | Cok |
| 2017/0187976 | A1 | 6/2017 | Cok |
| 2017/0188427 | A1 | 6/2017 | Cok et al. |
| 2017/0206820 | A1 | 7/2017 | Cok et al. |
| 2017/0206845 | A1 | 7/2017 | Sakariya et al. |
| 2017/0330509 | A1 | 11/2017 | Cok et al. |
| 2017/0338374 | A1 | 11/2017 | Zou et al. |
| 2017/0352647 | A1 | 12/2017 | Raymond et al. |
| 2018/0130414 | A1 * | 5/2018 | Hekmatshoartabari ............... H01L 29/802 |
| 2018/0131886 | A1 | 5/2018 | Cok |
| 2018/0166512 | A1 | 6/2018 | Hack et al. |
| 2018/0190211 | A1 * | 7/2018 | Sakariya .............. G09G 3/3426 |
| 2018/0191978 | A1 | 7/2018 | Cok et al. |
| 2018/0315793 | A1 * | 11/2018 | Zhu ........................ H01L 33/48 |

FOREIGN PATENT DOCUMENTS

| | | | | |
|---|---|---|---|---|
| WO | WO-2006/099741 | A1 | 9/2006 | |
| WO | WO-2008/103931 | A2 | 8/2008 | |
| WO | WO-2010/032603 | A1 | 3/2010 | |
| WO | WO-2010/111601 | A2 | 9/2010 | |
| WO | WO-2010/132552 | A1 | 11/2010 | |
| WO | WO-2010132552 | A1 * | 11/2010 | ............ H01L 33/54 |
| WO | WO-2013/064800 | A1 | 5/2013 | |
| WO | WO-2013/165124 | A1 | 11/2013 | |
| WO | WO-2014/121635 | A1 | 8/2014 | |
| WO | WO-2014/149864 | A1 | 9/2014 | |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

DIGITAL-DRIVE PULSE-WIDTH-MODULATED OUTPUT SYSTEM

PRIORITY APPLICATION

This application claims priority to and benefit of U.S. Patent Application No. 62/444,753, filed Jan. 10, 2017, entitled Digital-Drive Pulse-Width-Modulated Output System, by Rotzoll et al., the content of which is incorporated by reference in its entirety.

CROSS REFERENCE TO RELATED APPLICATIONS

Reference is made to U.S. patent application Ser. No. 14/835,282 filed Aug. 25, 2015, entitled Bit-Plane Pulse Width Modulated Digital Display System, by Cok et al., U.S. patent application Ser. No. 15/005,869, filed Jan. 25, 2016, entitled Distributed Pulse Width Modulation Control, by Cok, and U.S. Provisional Patent Application No. 62/334,351, filed May 10, 2016, entitled Multi-Pixel Distributed Pulse Width Modulation Control, by Cok et al., the contents of which are incorporated by reference herein in their entirety.

FIELD OF THE INVENTION

The present invention relates to display systems using digital pixel values driven by pulse-width modulation.

BACKGROUND OF THE INVENTION

Flat-panel displays are widely used in conjunction with computing devices, in portable devices, and for entertainment devices such as televisions. Such displays typically employ an array of pixels distributed over a flat display substrate to display images, graphics, or text. In a color display, each pixel includes sub-pixel light emitters that emit light of different colors, such as red, green, and blue. For example, liquid crystal displays (LCDs) employ color filters with liquid crystals to block or transmit light from a backlight behind the liquid crystals and organic light-emitting diode (OLED) displays rely on passing current through a layer of organic material that glows in response to the current. Displays using inorganic light emitting diodes (inorganic LEDs or iLEDs) are also in widespread use for outdoor signage and have been demonstrated in a 55-inch television.

Displays are typically controlled with either a passive-matrix (PM) control employing electronic circuitry external to the display substrate or an active-matrix (AM) control employing electronic circuitry formed directly on the display substrate and associated with each light-emitting element. Both OLED displays and LCDs using passive-matrix control and active-matrix control are available. An example of such an AM OLED display device is disclosed in U.S. Pat. No. 5,550,066.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon or poly-crystalline silicon and is distributed over the entire flat-panel display substrate. The semiconductor layer is photolithographically processed to form electronic control elements, such as transistors and capacitors. Additional layers, for example insulating dielectric layers and conductive metal layers are provided, often by evaporation or sputtering, and photolithographically patterned to form electrical interconnections, or wires.

Typically, each display sub-pixel is controlled by one control element, and each control element includes at least one transistor. For example, in a simple active-matrix organic light-emitting diode (OLED) display, each control element includes two transistors (a select transistor and a power transistor) and one capacitor for storing a charge specifying the luminance of the sub-pixel. Each OLED element employs an independent control electrode connected to the power transistor and a common electrode. In contrast, an LCD typically uses a single transistor to control each pixel. Control of the light-emitting elements is usually provided through a data signal line, a select signal line, a power connection and a ground connection. Active-matrix elements are not necessarily limited to displays and can be distributed over a substrate and employed in other applications requiring spatially distributed control.

Liquid crystals are readily controlled by a voltage applied to the single control transistor. In contrast, the light output from both organic and inorganic LEDs is a function of the current that passes through the LEDs. The light output by an LED is generally linear in response to current but is very non-linear in response to voltage. Thus, in order to provide a well-controlled LED, it is preferred to use a current-controlled circuit to drive each of the individual LEDs in a display. Furthermore, inorganic LEDs typically have a different efficiency at different current, voltage, or luminance levels. It is therefore more efficient to drive the inorganic LED with a particular desired constant current over time.

Pulse width modulation (PWM) schemes control luminance by varying the time during which a constant current is supplied to a light emitter. A fast response to a pulse is desirable to control the current and provide good temporal resolution for the light emitter. However, capacitance and inductance inherent in circuitry on a light-emitter substrate can reduce the frequency with which pulses can be applied to a light emitter. This problem is sometimes addresses by using pre-charge current pulses on the leading edge of the driving waveform and sometimes a discharge pulse on the trailing edge of the waveform. However, this increases power consumption in the system and can, for example, consume approximately half of the total power for controlling the light emitters.

Pulse-width modulation is used to provide dimming for light-emissive devices such as back-light units in liquid crystal displays. For example, U.S. Patent Publication No. 20080180381 describes a display apparatus with a PWM dimming control function in which the brightness of groups of LEDs in a backlight are controlled to provide local dimming and thereby improve the contrast of the LCD.

Digital displays can have pulse-width-modulated control, for example a time-interleaved bit-addressed weighted pulse width modulation method described in U.S. Pat. No. 5,731,802. U.S. Patent Application Publication No. 2009/0147033 describes a color display system with a PWM-controlled spatial light modulator. U.S. Patent Application Publication No. 2010/0085295 describes a frame-synchronized PWM signal for strings of LEDs in a display device. However, significant power is required to repeatedly load data values into the display elements for display.

U.S. Patent Application Publication No. 2010/0045690 describes a digital display with a timing-selectable gamma. Complex and large logic circuits are necessary for such displays and reduce their resolution.

OLED displays are also known to include PWM control, for example as taught in U.S. Patent Application Publication No. 2011/0084993. In this design, a storage capacitor is used to store the data value desired for display at the pixel. A variable-length control signal for controlling a drive transistor with a constant current is formed by a difference between the analog data value and a triangular wave form. However, this design requires a large circuit and six control signals, limiting the display resolution for a thin-film transistor backplane. U.S. Patent Application Publication Nos. 2013/0141469 and 2011/0084993 also require switching the power provided to the pixel circuit which causes large current swings over the display substrate. U.S. Patent Application Publication No. 2015/0302795 describes a digitally controlled active-matrix OLED display.

U.S. Pat. No. 7,738,001 describes a passive-matrix control method for OLED displays. By comparing a data value to a counter, a binary control signal indicates when the pixel should be turned on. This approach requires a counter and comparison circuit for each pixel in a row and is only feasible for passive-matrix displays. U.S. Pat. No. 5,731,802 describes a passive-matrix control method for displays. However, large passive-matrix displays suffer from flicker.

U.S. Pat. No. 5,912,712 discloses a method for expanding a pulse width modulation sequence to adapt to varying video frame times by controlling a clock signal. This design does not use pulse width modulation for controlling a display pixel.

There remains a need, therefore, for an active-matrix display system that provides an efficient, constant current drive signal to a light emitter and has a high resolution with reduced size active-matrix controllers and light emitters.

SUMMARY OF THE INVENTION

The present invention is, among various embodiments, a digital-drive display system comprising an array of pixels arranged in rows and columns. Each pixel has an output device, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the output device during an uninterrupted output time period subsequent to the load time period. A controller external to the array of pixels provides to each pixel the load timing signal and the multi-bit digital pixel value during the load time period and provides the PWM timing signal during the output time period. The PWM timing signal has multiple different timing periods that are sequentially provided at different times to the pixels, each timing period having a different temporal length corresponding to a bit of the multi-bit digital pixel value.

Constant current sources are useful for driving iLEDs because iLEDs are typically most efficient within a limited range of currents so that a temporally varied constant current drive is more efficient than a variable current or variable voltage drive. However, conventional schemes for providing temporal control, for example pulse width modulation, are generally employed in passive-matrix displays which suffer from flicker and are therefore limited to relatively small displays. A prior-art constant-current drive used in an OLED active-matrix display requires analog storage and complex control schemes with relatively large circuits and many control signals to provide a temporal control, limiting the density of pixels on a display substrate.

The present invention addresses these limitations by providing multi-bit digital storage for a digital pixel value in a serial digital memory at each display pixel location. Digital data is serially transferred to the pixels to reduce the number of interconnections and wires in the system, enabling digital pixel control with only two signal wires. Digital storage is not practical for conventional flat-panel displays that use thin-film transistors because the thin-film circuits required for digital pixel value storage are much too large to achieve desirable display resolution. However, according to the present invention, small micro transfer printed integrated circuits (chiplets) having a crystalline semiconductor substrate can provide small, high-performance serial digital memory circuits and temporally controlled constant-current LED drive circuits in a digital display with practical resolution. Such a display has excellent resolution because the chiplets are very small, has excellent efficiency by using constant-current drive for LEDs, has reduced flicker by using an active-matrix control structure, and can be readily scaled to very large displays.

A pixel controller integrated circuit can have a separate, independent, and distinct substrate from a display substrate and an output device (such as a light emitter) can have an integrated circuit having a substrate separate, independent, and distinct from the pixel controller integrated circuit and from a display substrate.

In other embodiments, the serial digital memory stores three independent multi-bit digital pixel values and each pixel has three output devices and three drive circuits responsive to the same PWM timing signal at the same time. Each of the three output devices is responsive to a different one of the three multi-bit digital pixel values stored in the serial digital memory. The pixel-control integrated circuit can incorporate the serial digital memory and the drive circuits in one integrated circuit device with its own substrate and can be a micro-transfer printed device having a broken or separated tether. Similarly, the output devices can each include a separate, independent, and distinct substrate from the pixel-control integrated circuit and from a display substrate that can be micro-transfer printed and have a broken or separated tether. Such embodiments can provide an efficient, full-color, scalable flat-panel display.

In an embodiment, the pixels are spatially distributed over the display substrate and are separated by a distance greater than the distance between any of the output device, serial digital memory, and drive circuit of the pixel, thus enabling high resolution and providing space over the display substrate for additional functions.

In a configuration, at least one of the different PWM time periods has a temporal length that is unequal to a power of two times the shortest PWM time period.

In an embodiment, the controller comprises serially connected row controllers having separate, independent and distinct substrates each connected to a row of pixels. In another embodiment, the controller comprises serially connected column drivers having separate, independent and distinct substrates each connected to a column of pixels.

The controller can provide a load timing signal and a PWM timing signal to all of the pixels in a row.

The controller can apply PWM timing signals to rows of pixels that are ordered differently from or are temporally out of phase with the PWM time periods of another, different row of pixels. Alternatively, the controller applies PWM timing signals to columns of pixels that are ordered differently from or are temporally out of phase with the PWM time periods of another, different column of pixels.

The pixels can be controlled by only two control signals, exclusive of any power or ground connections. The power or ground signals can be constant and not modulated to provide signal information.

In an embodiment, the output time period is greater than or equal to twice the duration of the PWM timing signal.

Each pixel can comprise a separate, independent, and distinct pixel substrate on which each of the output devices is individually mounted and a pixel controller integrated circuit including the serial digital memory and drive circuit is mounted. The pixel substrate can be a micro-transfer printed substrate and can have a broken or separated tether.

A controller external to the array of pixels can periodically provide an array of multi-bit digital pixel values to the pixels at a frame rate having a frame period, where the frame period includes a load time period and an output time period. The output time period can include one or more PWM timing signals and have a temporal duration greater than the temporal duration of a PWM timing signal.

In an embodiment of the present invention, an active-matrix digital PWM display having a display area comprises an array of pixels forming rows and columns disposed in the display area. Each pixel has an output device, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the output device during an uninterrupted output time period subsequent to the load time period. A row-select line is connected in common to each row of pixels and a column-data line is connected in common to each column of pixels. An array of row controller chiplets are serially connected. Each row controller chiplet can have a separate, independent and distinct substrate external to the substrate display area of the array of pixels and is connected to a row of pixels providing in common to each pixel in the row the load timing signal during the load time period and the PWM timing signal during the output time period. The PWM timing signal has multiple different PWM time periods that are sequentially provided at different times to the pixels. Each timing period has a different temporal length corresponding to a bit of the multi-bit digital pixel value.

An array of column drivers can be serially connected. Each column driver can have a separate, independent and distinct substrates and each column driver is connected to a column-data line. The column drivers sequentially provide the bits of the multi-bit digital pixel values to each column of pixels 20 and the row controllers and the column drivers can be micro-transfer printed and each have a broken or separated tether.

The row controller can provide a load timing signal to the row-select lines in conjunction with the column driver sequentially providing the bits of the multi-bit digital pixel values on the column-data lines. A first row controller can provide a load timing signal to a first row of pixels at the same time as a second row controller different from the first row controller provides a PWM timing signal to a second row of pixels different from the first row. The row controller can provide two or more output time periods for every load time period.

According to an embodiment of the present invention, a method of controlling an active-matrix digital PWM display includes providing an array of multi-bit digital pixel values having rows and columns of multi-bit digital pixel values corresponding to the rows and columns of pixels in the array of pixels, providing a load signal on the row-select line of a row of pixels with the row controller connected to the row-select line and, at the same time, sequentially providing the bits of the corresponding multi-bit digital pixel values to the column-data lines during a load time period, and subsequent to the load time period, providing a PWM timing signal one or more times to the row-select line during the output time period.

In one aspect, the disclosed technology includes an active-matrix digital-drive display system, including: an array of pixels arranged in rows and columns, each pixel having an output device, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the output device during an uninterrupted output time period subsequent to the load time period; a controller external to the array of pixels providing to each pixel the load timing signal and the multi-bit digital pixel value during the load time period and the PWM timing signal during the output time period; wherein the PWM timing signal has multiple different PWM time periods that are sequentially provided at different times to the pixels, each PWM time period having a different temporal length corresponding to a different bit of the multi-bit digital pixel value.

In certain embodiments, the one or more output devices are a light-emitter, light-controller, a light-emitting diode, or an inorganic light-emitting diode that emits light.

In certain embodiments, the serial digital memory and drive circuit of each pixel is provided in a single pixel-control integrated circuit having a separate, independent, and distinct substrate and a broken or separated tether and the output device is provided in an integrated circuit having a substrate separate, independent, and distinct from the pixel-control integrated circuit and a broken or separated tether.

In certain embodiments, the serial digital memory stores three independent multi-bit digital pixel values and each pixel has three output devices and three drive circuits responsive to the same PWM timing signal at the same time, each of the three output devices responsive to a different one of the three multi-bit digital pixel values stored in the serial digital memory.

In certain embodiments, the serial digital memory and the three drive circuits of each pixel are provided in a single pixel-control integrated circuit having a separate, independent, and distinct substrate and a broken or separated tether and the output devices are each provided in an integrated circuit having a substrate separate, independent, and distinct from the pixel-control integrated circuit and a broken or separated tether.

In certain embodiments, digital-drive display includes a display substrate and the pixels are spatially distributed over the display substrate and are separated by a distance greater than the distance between any of the output device, serial digital memory, and drive circuit of a pixel.

In certain embodiments, at least one of the different PWM time periods has a temporal length that is unequal to a power of two times the shortest PWM time period.

In certain embodiments, the controller provides a load timing signal and a PWM timing signal to all of the pixels in a row.

In certain embodiments, the controller comprises serially connected row controllers having separate, independent and distinct substrates each connected to a row of pixels or wherein the controller comprises serially connected column drivers having separate, independent and distinct substrates each connected to a column of pixels.

In certain embodiments, the controller applies PWM timing signals to rows of pixels, and wherein the PWM time periods provided to at least one row of pixels are ordered differently from or are temporally out of phase with the PWM time periods of another, different row of pixels or wherein the controller applies PWM timing signals to columns of pixels, and wherein the PWM time periods provided to at least one column of pixels are ordered differently from or are temporally out of phase with the PWM time periods of another, different column of pixels.

In certain embodiments, the pixels are controlled by only two control wires, exclusive of any power or ground connections.

In certain embodiments, the output time period is greater than or equal to twice the duration of the PWM timing signal.

In certain embodiments, each pixel comprises a separate, independent, and distinct pixel substrate on which each of the output devices is individually mounted and a pixel-control integrated circuit including the serial digital memory and drive circuit is mounted.

In certain embodiments, the pixel substrate has a broken or separated tether.

In another aspect, the disclosed technology includes an active-matrix digital PWM display having a display area, including: an array of pixels forming rows and columns disposed in the display area, each pixel having an output device, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the output device during an uninterrupted output time period subsequent to the load time period; an array of row-select lines, each row-select line connected in common to a different row of pixels; an array of column-data lines connected in common to each column of pixels; an array of serially connected row controllers having separate, independent and distinct substrates external to the array of pixels, each row controller connected to a row of pixels providing in common to each pixel in the row the load timing signal during the load time period and the PWM timing signal during the output time period; wherein the PWM timing signal has multiple different PWM time periods that are sequentially provided at different times to the pixels, each timing period having a different temporal length corresponding to a different bit of the multi-bit digital pixel value.

In certain embodiments, the digital PWM display includes column drivers having separate, independent and distinct substrates, each column driver connected to a column-data line, the column drivers sequentially providing the bits of the multi-bit digital pixel values, and the row controllers and the column drivers each having a broken or separated tether.

In certain embodiments, the row controller provides a load timing signal to the row-select lines in conjunction with the column driver sequentially providing the bits of the multi-bit digital pixel values on the column-data lines.

In certain embodiments, a first row controller provides a load timing signal to a first row of pixels at the same time as a second row controller different from the first row controller provides a PWM timing signal to a second row of pixels different from the first row.

In certain embodiments, the row controller provides two or more output time periods for every load time period.

In another aspect, the disclosed technology includes a method of controlling an active-matrix digital PWM display, including: providing an array of multi-bit digital pixel values having rows and columns of multi-bit digital pixel values corresponding to the rows and columns of pixels in the array of pixels; providing a load signal on the row-select line of a row of pixels with the row controller connected to the row-select line and, at the same time, sequentially providing the bits of the corresponding multi-bit digital pixel values to the column-data lines during a load time period; and subsequent to the load time period, providing a PWM timing signal one or more times to the row-select line during the output time period.

In another aspect, the disclosed technology includes an active-matrix digital-drive system, including: an array of elements arranged in rows and columns, each element having an output device, a serial digital memory responsive to a load timing signal for receiving and storing a multi-bit digital element value during an uninterrupted load time period, and a drive circuit responsive to a pulse-width-modulation (PWM) timing signal and to the multi-bit digital element value to drive the output device during an uninterrupted output time period subsequent to the load time period; and a controller external to the array of elements providing to each element the load timing signal and the multi-bit digital elements value during the load time period and the PWM timing signal during the output time period; wherein the PWM timing signal has multiple different PWM time periods that are sequentially provided at different times to the elements, each PWM time period having a different temporal length corresponding to a different bit of the multi-bit digital element value.

The present invention provides a highly integrated active-matrix micro-LED display with small micro-controllers associated with each pixel. By providing external load, digital data, and PWM timing signals with row-select and column-data lines, the total pixel circuitry is reduced while enabling a flexible, scalable, and efficient digital display system.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
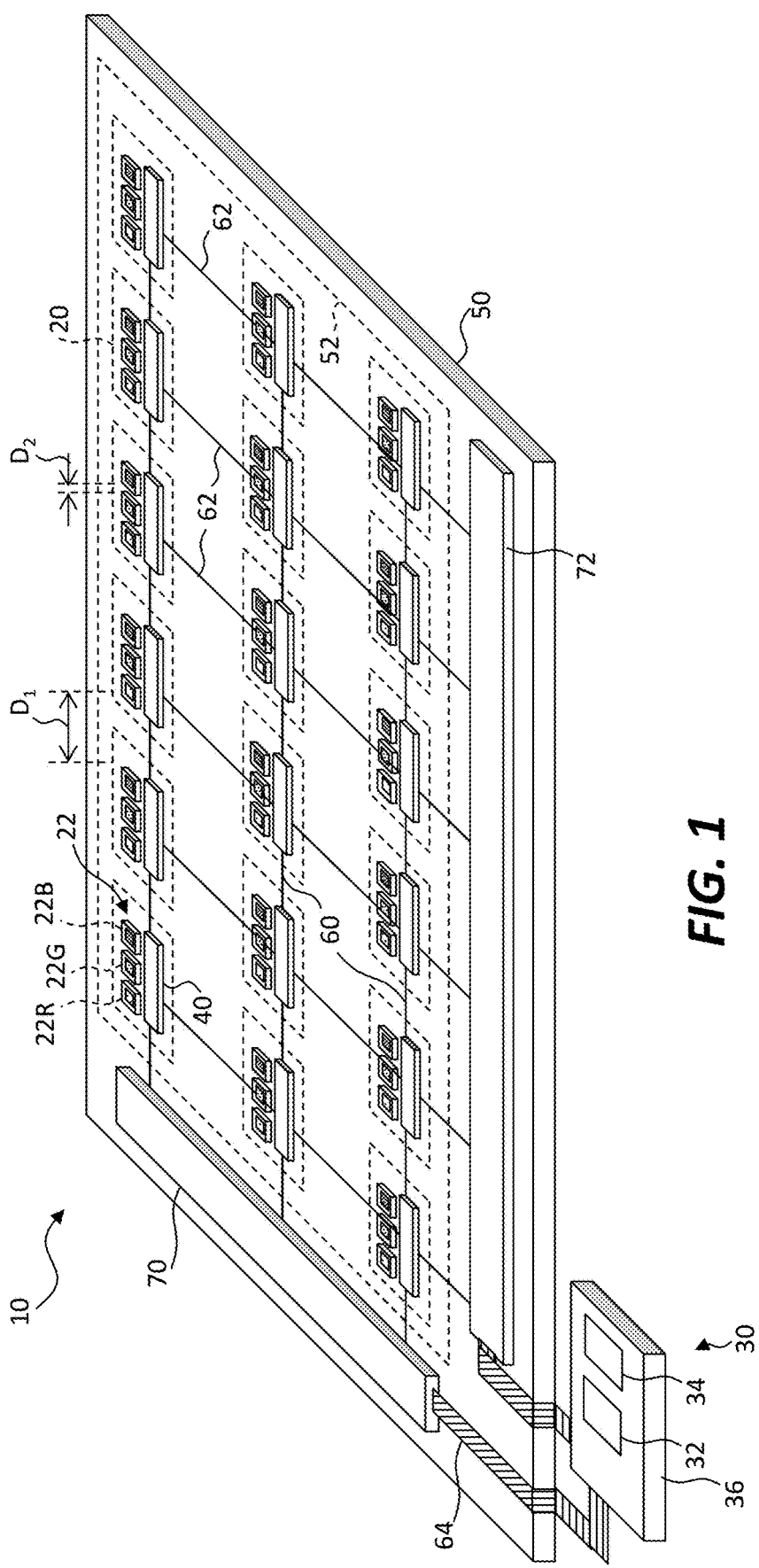
FIG. 1 is a schematic perspective of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Embodiments of the present invention provide a scalable active-matrix digital display having efficient constant-current output suitable for inorganic light-emitting diodes. Referring to the perspective illustration of FIG. 1 and the corresponding detailed schematic of FIG. 2, a digital-drive display system 10 includes an array of pixels 20 arranged in rows and columns on a display substrate 50. Each pixel 20 has an output device 22, a serial digital memory 24 responsive to a load timing signal for receiving and storing a multi-bit digital pixel value during an uninterrupted load time period, and a drive circuit 26 responsive to a pulse-width-modulation (PWM) timing signal and to the multi-bit digital pixel value stored in the serial digital memory 24 to drive the output device 22 during an uninterrupted output time period subsequent to the load time period. The serial digital memory 24 can be, for example, a multi-bit digital random-access memory (e.g., an SRAM or DRAM) controlled to read and write data serially, as shown, or a logically controlled shift register (shown in FIG. 3) and the pixel 20 can include a state machine for controlling the function of the pixel 20, as shown.

An uninterrupted load time period is a load time period in a pixel 20 during which the multi-bit digital pixel value is not output by the output devices 22 and an uninterrupted output time period in a pixel 20 is an output time period during which no loading takes place, so that the load time period and the output time period within a pixel 20 do not temporally overlap. Thus, within a pixel 20, the load time period is not interrupted by output and the output time period is not interrupted by loading. However, the load time period in one pixel can overlap the output time period in a different pixel, for example a pixel 20 in a different row of the array of pixels 20. The load time period includes the time necessary to load the entire multi-bit digital pixel value into the serial digital memory 24 of a pixel 20.

A pixel 20 can include more than one output device 22 and a separate drive circuit 26 can be provided for each output device 22 and can be controlled by a common state machine including flip-flops (FF). The common state machine can also control data reading from and data writing to the multi-bit serial digital memory 24. A controller 30 external to a substrate display area 52 of the array of pixels 20 can provide the load timing signal and the PWM timing signal to each pixel 20. The controller 30 can be a display controller 30 including a row controller 70, a column-data controller 72, a loading circuit 32 and control circuit 34 formed in a separate display controller substrate 36.

The PWM timing signal includes multiple different PWM time periods that are sequentially provided at different times to the pixels 20. Each PWM time period has a different temporal length corresponding to a different bit of the multi-bit digital pixel value (providing a weighted PWM signal). The output devices 22 are controlled to be on for the PWM time period when the corresponding bit of the multi-bit digital pixel value is logically ON and off for the PWM time period when the corresponding bit of the multi-bit digital pixel value is logically OFF, so that the amount output is specified by the ratio of the sum of the temporal durations of the ON PWM time periods to the temporal duration of the entire PWM timing signal. The entire PWM timing signal must be able to switch at a sufficient rate and have a temporal duration small enough to avoid perceptible flicker. In an embodiment, the drive circuit 26 provides a constant current that is supplied to the output devices 22 for the duration of a PWM time period that is logically ON and corresponds to a logically ON bit of the stored digital pixel value to drive the output devices 22 to emit light in response to the PWM timing signal.

In embodiments of the present invention, the output device 22 is a light-emitter 22, a light-emitting diode (LED), or an inorganic light-emitting diode (iLED) that emits light. The serial digital memory 24 and drive circuit 26 of each pixel 20 can be provided in a single pixel controller 40 integrated circuit 80, for example a silicon CMOS circuit or mixed-signal circuit with a substrate separate, independent, and distinct from the display substrate 50. The output device(s) 22 can also be provided in a separate device having a substrate separate, independent, and distinct from the pixel controller 40 and the display substrate 50.

In embodiments of the present invention, the light emitter (output device) 22 is an inorganic light-emitting diode or an organic light-emitting diode. When the display pixels 20 include multiple light emitters 22, the light emitters 22 can be a red light emitter 22R that emits red light, a blue light emitter 22B that emits blue light, and a green light emitter 22G that emits green light. The multi-bit serial digital memory 24 can store a red digital pixel value, a green digital pixel value, and a blue digital pixel value and the drive circuit 26 can drive the red, green, and blue light emitters 22R, 22G, 22B to each emit colored light in response to the corresponding red, green, and blue multi-bit digital pixel values stored in the serial digital memory 24.

Thus, in an embodiment, the serial digital memory 24 can store three independent multi-bit digital sub-pixel values (e.g., corresponding to red, green, and blue sub-pixels) and each pixel 20 can have three output devices 22 and three drive circuits 26 responsive to the same PWM timing signal. Each of the three output devices 22 (e.g., 22R, 22G, 22B) can be responsive to a different one of the three multi-bit digital sub-pixel values in the serial digital memory 24 and can emit a different color of light (e.g., red, green, and blue light). The serial digital memory 24 and the three drive circuits 26 of each pixel 20 can be provided in a single pixel controller 40 integrated circuit 80. The output device 22 can be different from the single pixel controller 40 integrated circuit 80 and can have a separate, distinct, and independent substrate. Different output devices 22 (e.g., 22R, 22G, 22B) can have separate, independent, and distinct substrates from the pixel controller 40 or from the display substrate 50, for example made of different semiconductor materials such as different kinds of compound semiconductor materials.

Figure 2:
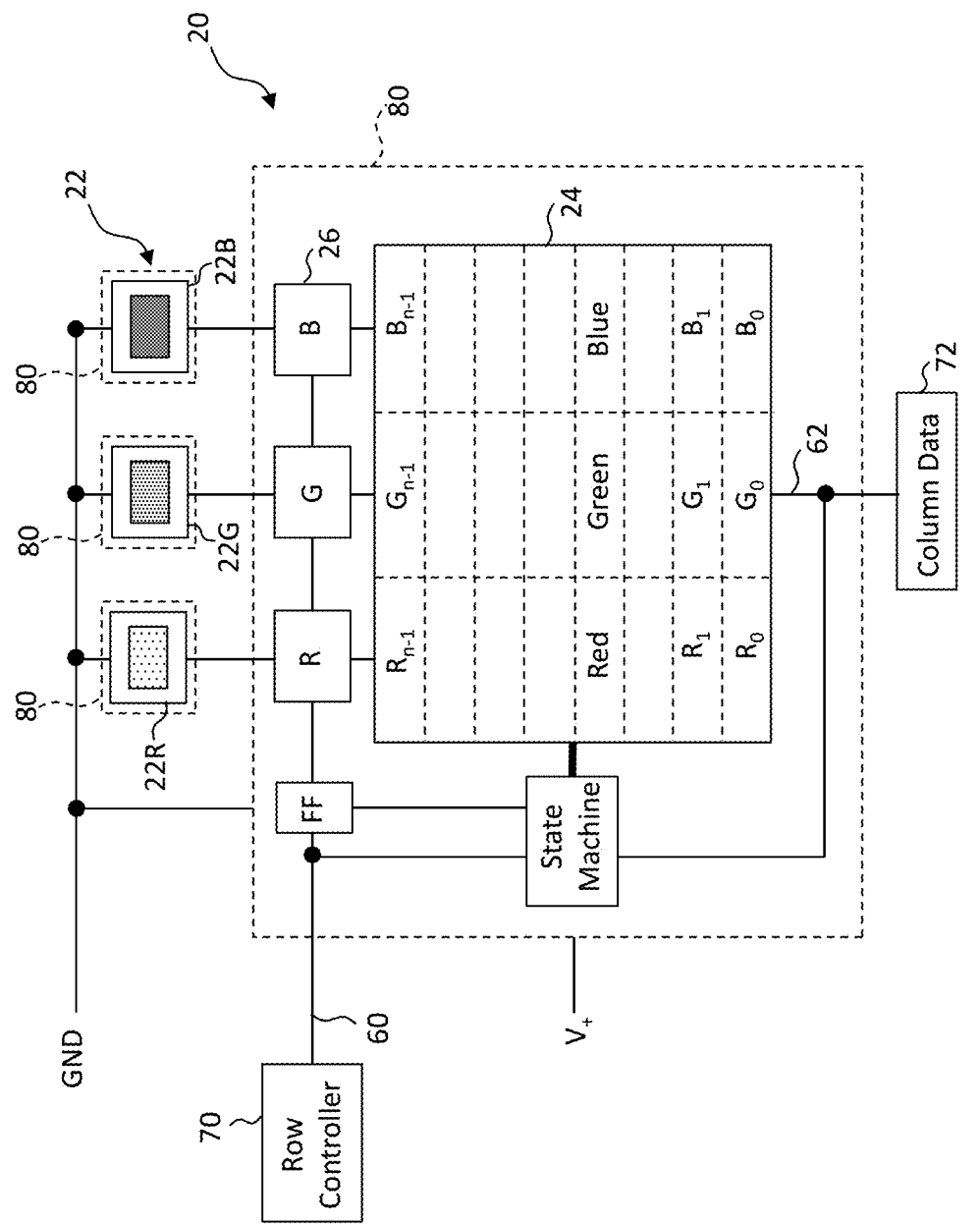
FIG. 2 is a more detailed schematic of the embodiment of FIG. 1.

As shown in FIG. 2, the serial digital memory 24 can incorporate a random-access memory (RAM). In the illustrated example, the RAM can be a three-bit memory with eight addressable locations. One bit is provided for each color of output device 22. The state machine sequentially generates the addresses for the RAM corresponding to the bits provided on the column-data line 62 to store the multi-bit digital pixel value during the load time period. Similarly, during the output time period, the state machine sequentially generates the addresses for the RAM corresponding to the bits provided to the output devices 22. For a multi-bit digital pixel value with more bits, the RAM has more addressable storage locations.

Figure 3:
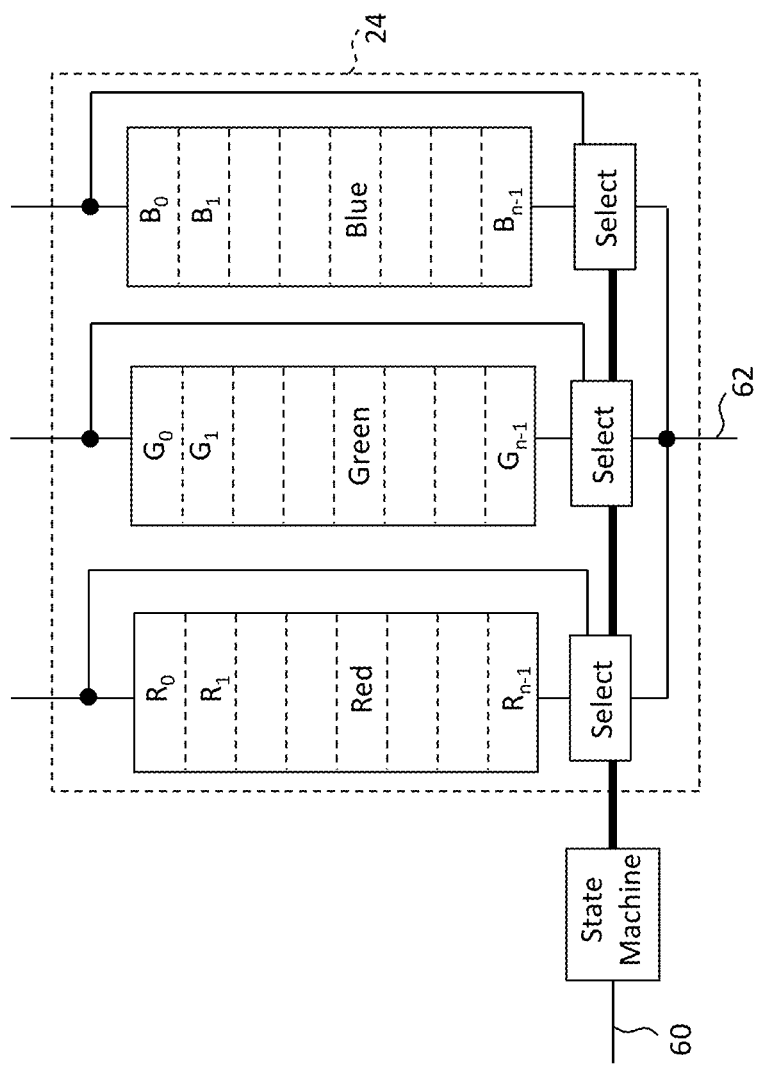
FIG. 3 is a schematic of an alternative serial digital memory according to an embodiment of the present invention.

As shown in FIG. 3, the serial digital memory 24 can incorporate three serial shift registers, one for each color of output device 22. The state machine selects either the bits provided on the column-data line 62 to store the multi-bit digital pixel value during the load time period or, during the output time period, the state machine selects the bits provided to the output devices 22 to recirculate the bits around the serial shift register. (The clock signal is not illustrated but conventionally controls the shift register to transfer the stored bits through the serial shift registers under the control of the state machine.) For a multi-bit digital pixel value with more bits, the serial shift register is longer and includes more storage locations.

The PWM digital-drive display system 10 can be an active-matrix display using matrix addressing, for example provided by an array of row-select lines 60 each of which is connected in common to a different row of pixels 20. An array of column-data lines 62 is connected in common to each column of pixels 20. The row-select lines 60 and column-data lines 62 can be metal wires or traces formed on the display substrate 50 that conduct electrical signals, for example the load timing signal, the PWM timing signal, and a column data signal. The row controller 70 can provide signals on the row-select lines 60 and the column-data controller 72 can provide signals on the column-data lines 62.

In an embodiment of the present invention, the pixels 20 are each controlled by a unique pair of only two control wires, for example row-select line 60 and column-data line 62, exclusive of any power or ground connections. Thus, in an embodiment, the pixels 20 have only four electrical connections (row-select line 60, column-data line 62, power, and ground). The load timing signal, the PWM timing signal, and a column-data signal carrying the multi-bit digital pixel values are all communicated on the two lines. In this embodiment, the power and ground signals are not modulated to provide information or control signals. This configuration provides advantages in consistency with analog display designs and reduces wiring requirements on the display substrate 50.

Figure 4:
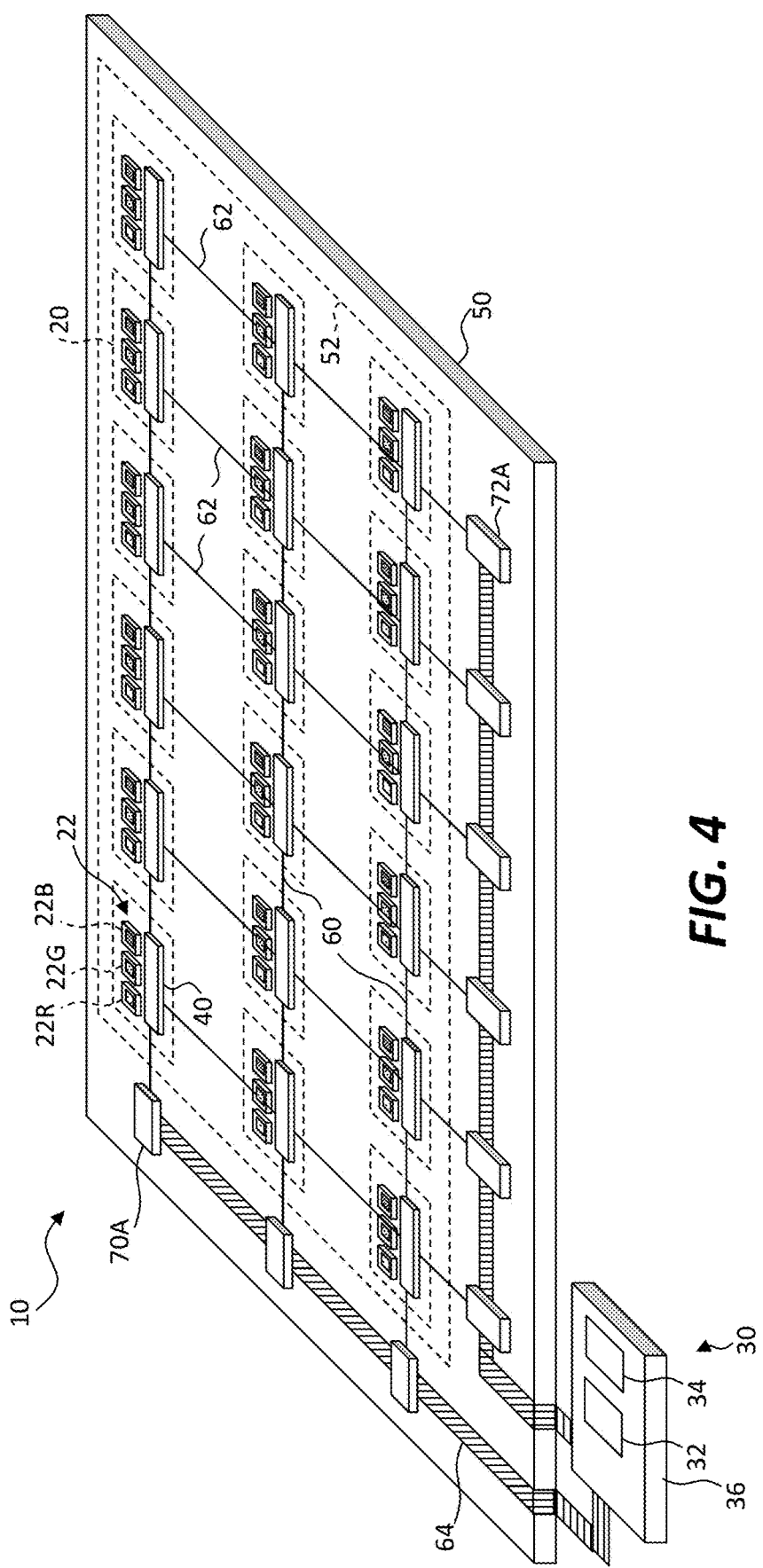
FIG. 4 is a schematic perspective of an alternative embodiment of the present invention having distributed control chiplets.

Referring to FIG. 4, the row controller 70 can include an array of serially connected row-controller chiplets 70A each having separate, independent and distinct substrates external to the substrate display area 52 of the array of pixels 20. Each row-controller chiplet 70A is connected through a row-select line 60 to a row of pixels 20. Similarly, the column-data controller 72 can include an array of serially connected column-data controller chiplets 72A each having separate, independent and distinct substrates external to the substrate display area 52 of the array of pixels 20. Each column-data controller chiplet 72A is connected through a column-data line 62 to a column of pixels 20. The serially connected row-controller chiplets 70A can pass a row-select token along the series to sequentially enable each row of pixels 20 on a row-select line 60. Bits of multi-bit digital pixel values can be sequentially passed through the serially connected column-data controller chiplets 72A to provide data to columns of pixels 20 on the column-data lines 62. Distributed row-controller and column-data chiplets enable display scalability and reduces the size and pin count of control integrated circuits.

A chiplet is a small integrated circuit, for example a digital logic circuit that is small enough to be micro-transfer printed and disposed at a sufficient resolution on the display substrate 50 to connect to the corresponding row-select and column-data lines 60, 62, and can be a bare semiconductor die. Each chiplet can have a separate, independent, and distinct substrate. The pixel controllers 40 and output devices 22 can also be chiplets with separate, independent, and distinct substrates. As used herein, separate, independent, and distinct substrates can be separately constructed, optionally at different times and at different locations using at least some different processes and on different wafers. After they are constructed, the separate, independent, and distinct substrates can be transported, manipulated, and stored separately and independently. The pixel controllers 40, the output devices 22 (e.g., iLEDs), the row-controllers 70A, and the column-data controllers 72A can all be chiplets having separate, independent, and distinct substrates. Moreover, all of the pixel controllers 40, the output devices 22 (e.g., iLEDs), the row-controller chiplets 70A, and the column-data controller chiplets 72A can be micro-transfer printed from a source wafer to a destination substrate or wafer and can therefore include broken or separated tethers 46 (illustrated and discussed further below in FIGS. 10, 11).

In another embodiment of the present invention, the digital-drive display system 10 comprises a display substrate 50. The pixels 20 are spatially distributed over the display substrate 50 and are separated by a distance D1 greater than the distance D2 between any of the output device 22, serial digital memory 24, and drive circuit 26 of a pixel 20. By separating the pixels 20 as described, improved color mixing within pixels 20 is achieved and, since the output devices 22 can be inorganic LEDs that have a very small light-emitting area and can approximate point light sources, additional area over the display substrate 50 is available for integrating other functionality into the digital-drive display system 10.

As shown in FIGS. 5-9, a load signal is initially provided to a row of pixels 20 for a load time period on the row-select line 60. (Rows and columns of pixels 20 are arbitrary designations in a pixel array and can be exchanged within the scope of the present invention. For clarity of presentation, the row-select lines 60 are chosen for the load and PWM timing signals and the column-data line 62 for the column data signal, but the invention is not limited to this embodiment.) The duration of the load time period will be specified by the number of bits of the multi-bit digital pixel value serially loaded into the multi-bit serial digital memory 24 provided at the same time on the column-data lines 62, for example 24 (three 8-bit color sub-pixel values), and the frequency of the load timing and column-data signals.

Once the multi-bit digital pixel value is loaded into the multi-bit serial digital memory 24 of each pixel 20 in the row, the PWM timing signal is provided on the row-select line 60, enabling the pixels 20 in the row to output from the output devices 22 in the pixels 20. At the same time, a different row of pixels 20 can be addressed by the row controller 70 to load the multi-bit digital pixel values into the corresponding multi-bit serial digital memories 24 of the different row of pixels 20. Thus, one row of pixels 20 is loaded while the other rows of pixels 20 output light corresponding to the stored multi-bit digital pixel values and at least two of the separate timing signals can be provided to different rows of pixels 20 at different times. Thus, the rows of pixels 20 can operate asynchronously, independently, or out-of-phase with each other.

Figure 5:
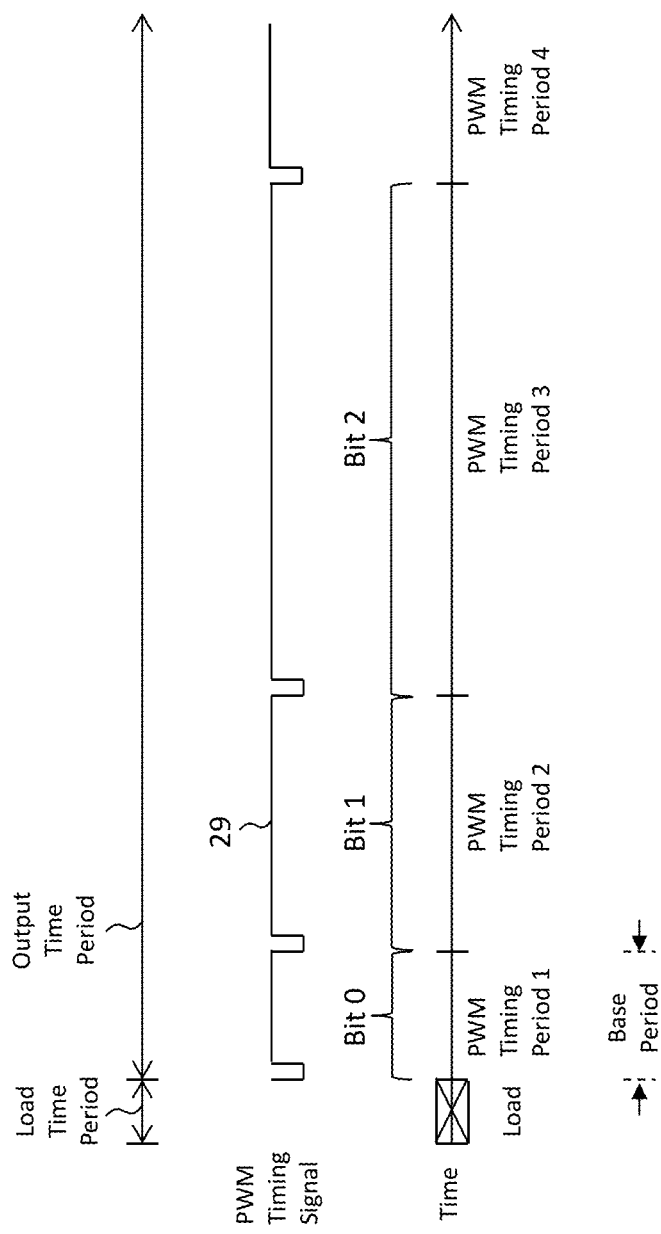
FIGS. 5-9 are timing illustrations according to embodiments of the present invention.

Referring to FIG. 5, the different PWM time periods can have temporal lengths that are different powers of two times a predefined base rate defining a base period. The base period is typically the period of the shortest PWM time period. The sum of the timing period temporal lengths of all of the different PWM time periods can be two to the power of the number of bits in the multi-bit digital pixel value times the base period minus one. FIG. 5 illustrates the PWM timing signal and periods, following an initial load cycle. The shortest (in this example the first) PWM time period is the base period and the temporal duration of the other PWM time periods are a power of two times the base period temporal duration.

Figure 6:
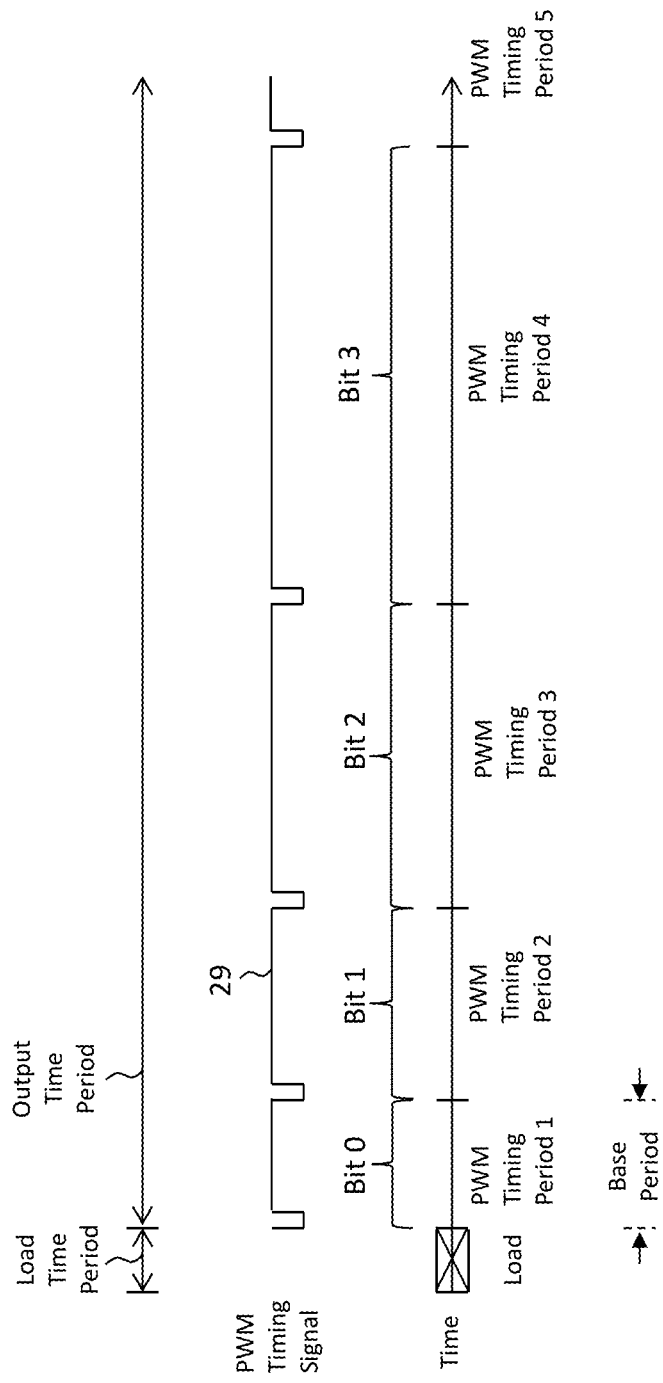

In the weighted PWM design shown in FIG. 5, each PWM time period has a temporal duration that is a power of 2 times the duration of the shortest PWM time period. In a different configuration shown in FIG. 6, one or more of the PWM time periods is unequal to a power of 2 times the duration of the shortest PWM time period. Because the human sensory system does not respond linearly to linear increases in ambient light illumination, it can be useful to transform image pixel values in a display to a mathematical space that more closely matches the response of the human visual system. This is typically performed by converting the pixel values through a look-up table, but such transformations can reduce the number of visibly distinctive light levels in a display system, so that additional pixel value bits are necessary to avoid contouring in a displayed image. By modifying the PWM time periods instead, such a transformation can be accomplished without requiring additional bits or losing perceptible light levels. FIG. 6 illustrates PWM time periods having a temporal duration that is a power of approximately 1.5 (rather than 2) times the base period temporal duration, but other embodiments can have PWM time periods with temporal durations that are multiples of the base period temporal duration that are powers greater or smaller than 2, as desired.

Figure 7:
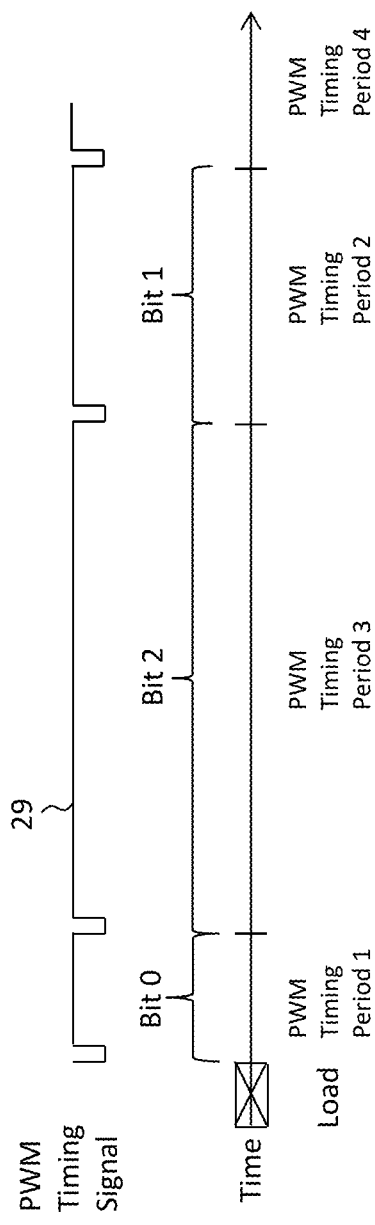

As shown in FIG. 7, the PWM time periods of at least one PWM timing signal provided to at least one row of pixels 20 can be ordered differently from the timing periods of another, different timing signal provided to another, different row of pixels 20. In general, the PWM time periods can be arbitrarily ordered (so long as the associated bits correspond at the same time to the bits of the multi-bit digital pixel value output from the multi-bit serial digital memory 24). Such bit reordering can be used to reduce flicker in the light output by the output devices 22.

Figure 8:
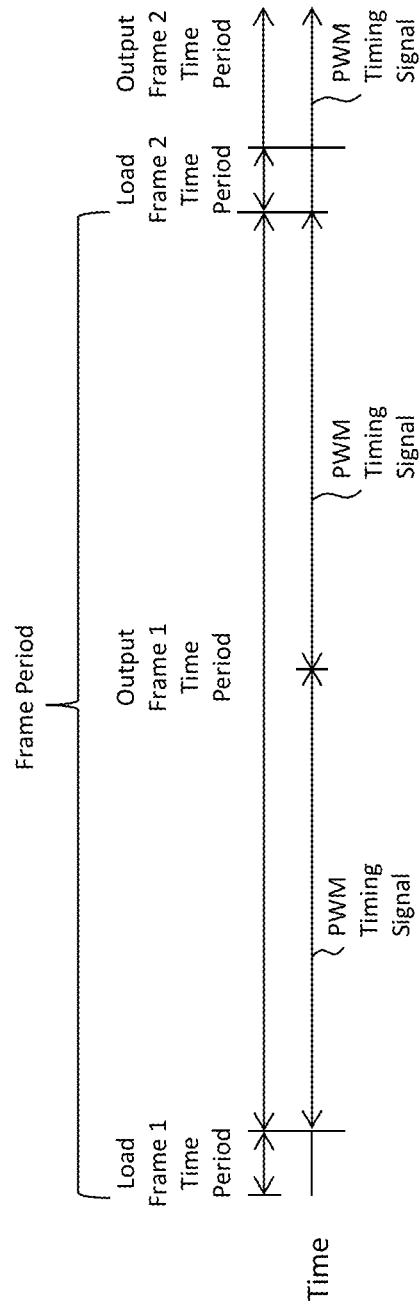
Figure 9:
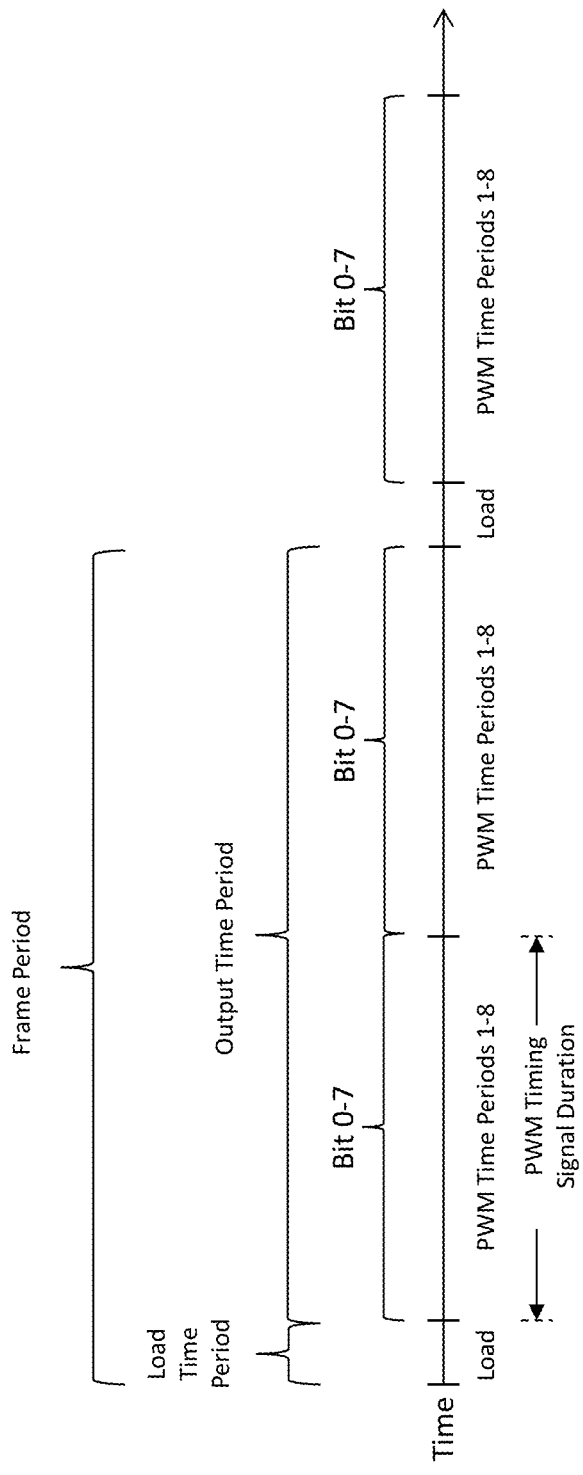

Referring to FIGS. 8 and 9, a frame period is the amount of time that a desired array of multi-bit digital pixel values are valid for the digital-drive display system 10 and includes the load time period (during which the output devices 22 can be turned off) and the output time period. The output time period can include multiple PWM timing signals so that the multi-bit digital pixel value is output multiple times (in this case two times) for each frame. This can also reduce flicker.

In another embodiment of the present invention, a digital-drive display system 10 comprises an array of pixels 20, each pixel 20 having an output device 22, a multi-bit serial digital memory 24 for storing a multi-bit digital pixel value, and a drive circuit 26 that drives the output device 22 for a PWM time period corresponding to the multi-bit digital pixel value. A controller 30 external to the array of pixels 20 periodically provides the multi-bit digital pixel values to the pixels 20 for a load time period and at a frame rate having a frame period. The remainder of the frame period that is not used for loading is used to drive the output devices 22 for the output time period. Since the pixels 20 are loaded a row at time, for example with the row controller 70, the pixels in the row can also be driven with the PWM timing signal in common. Thus, the circuitry necessary to construct the PWM timing signal is not necessarily repeated in each pixel 20, but can be provided in each row controller 70 circuit for each row of pixels 20, thereby significantly reducing the size of the active-matrix circuitry in each pixel 20. In an embodiment, the PWM timing signal is independently generated in each row-controller chiplet 70A. Alternatively, the PWM timing signal is generated in a row controller 70 or display controller 30 and provided in common to the rows of pixels 20 or independently to each rows of pixels 20.

Figure 10:
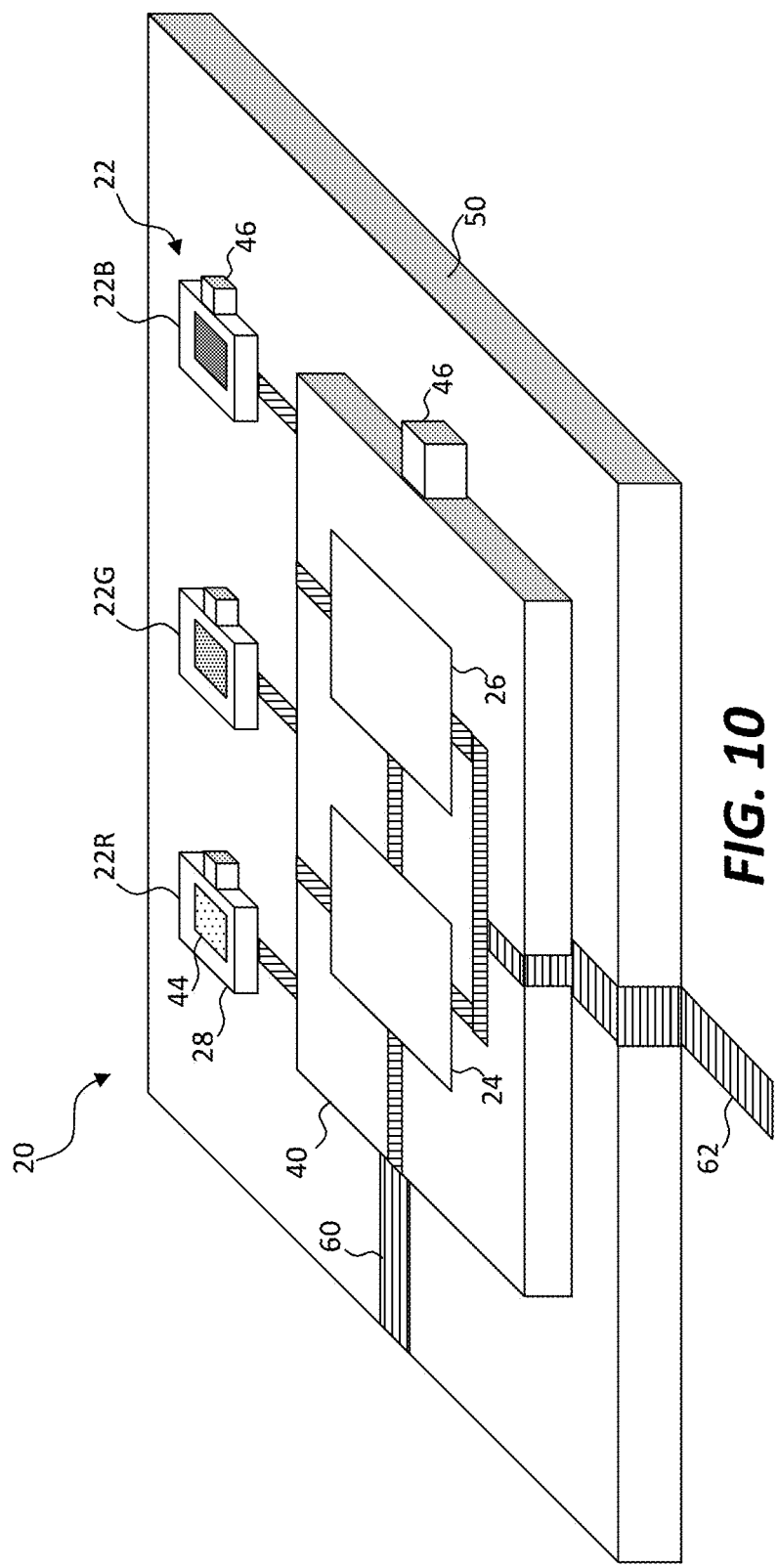
FIG. 10 is a schematic perspective of a pixel according to an embodiment of the present invention.

As shown in FIG. 10, in an embodiment of the present invention, the array of display pixels 20 is disposed on a display substrate 50. Each light emitter 22 includes a light-emitter substrate 28 and a broken or separated tether 46. The display substrate 50 can be separate, independent, and distinct from the light-emitter substrates 28. The light-emitter substrates 28 can be native substrates, that is the light emitters 22 (for example inorganic micro light-emitter diodes) can be constructed on or in a semiconductor source wafer, for example a GaN semiconductor formed on a sapphire wafer, separated from the source wafer, and disposed on the display substrate 50, for example by micro transfer printing, thereby breaking or separating the tether 46 that physically connected the light emitters 22 to the source wafer. The display substrate 50 is thus non-native to the light-emitter substrates 28.

Similarly, the serial digital memory 24 and the drive circuit 26 in each display pixel 20 can be formed as a pixel controller 40 integrated circuit 80, for example a chiplet having a silicon substrate using CMOS or mixed signal processes and designs to implement digital logic circuits and drive transistor circuits. Such materials and processes can form small, efficient, and fast circuits that are not available in thin-film transistor circuits, enabling additional functionality in the display pixels 20 of the present invention, in particular digital storage and logic circuits.

The pixel controller 40 can be formed in or on a substrate that is separate and distinct from the light-emitter substrate 28 and from the display substrate 50. As with the light emitters 22, the pixel controller 40 can be constructed on or in a semiconductor source wafer, for example a silicon semiconductor source wafer, and connected to the source wafer with a tether 46. The pixel controller 40 is separated from the source wafer and disposed on the display substrate 50, for example by micro transfer printing, thereby breaking or separating the tether 46 that physically connected the pixel controller 40 to the source wafer. The light emitters 22 and the pixel controller 40 can be interconnected with wires. Semiconductor wafers, light emitters 22, pixel controllers 40, and row-select lines 60 and column-data lines 62 can be made using photolithographic and integrated circuit materials and processes known in the integrated circuit and flat-panel display arts.

Figure 11:
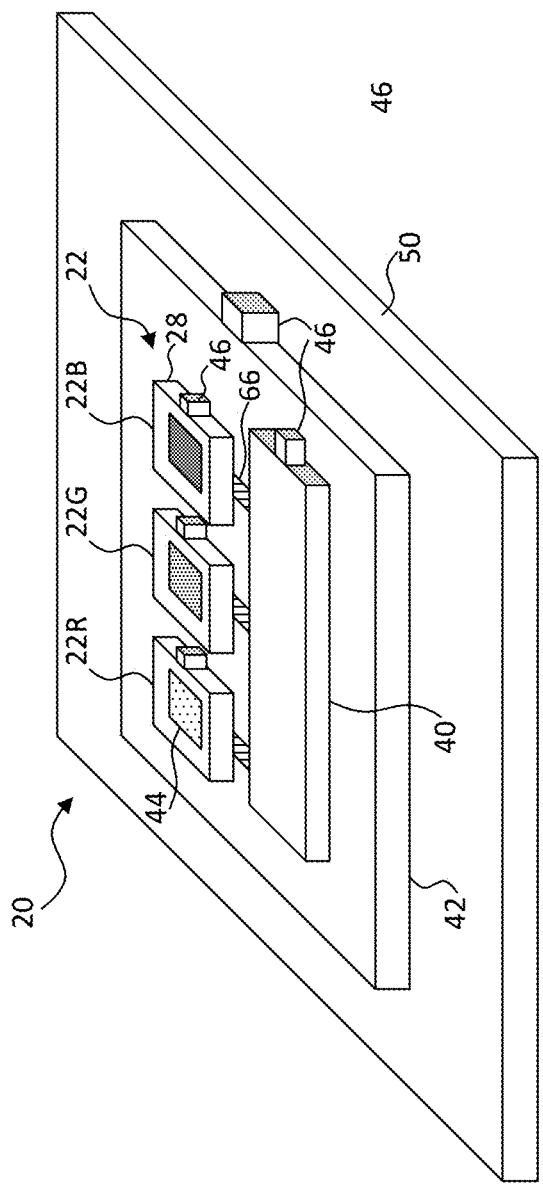
FIG. 11 is a schematic perspective of an alternative pixel according to an embodiment of the present invention.

In an alternative embodiment, referring to FIG. 11, the light emitters 22 and the pixel controller 40 are disposed on a pixel substrate 42 that is separate, independent, and distinct from the display substrate 50, separate, independent, and distinct from the light-emitter substrates 28, and separate, independent, and distinct from the pixel controller 40 substrate. The light emitters 22 can be electrically connected on the pixel substrate 42 using fine, high-resolution electrical interconnections 66 made, for example by photolithographic process found in semiconductor foundries. In yet another embodiment, the serial digital memory 24 and the drive circuit 26 are formed in or on and are native to the pixel substrate 42 and the light emitters 22 are disposed on the pixel substrate 42 (i.e., the substrate of the pixel controller 40 is the pixel substrate 42, as described above). In either case, the pixel substrate 42 is then disposed, for example by micro-transfer printing or vacuum pick-and-place tools, on the display substrate 50. The pixels 20 can then be electrically connected using relatively coarse electrical interconnections that are more readily formed over large substrates such as display substrate 50.

Figure 12:
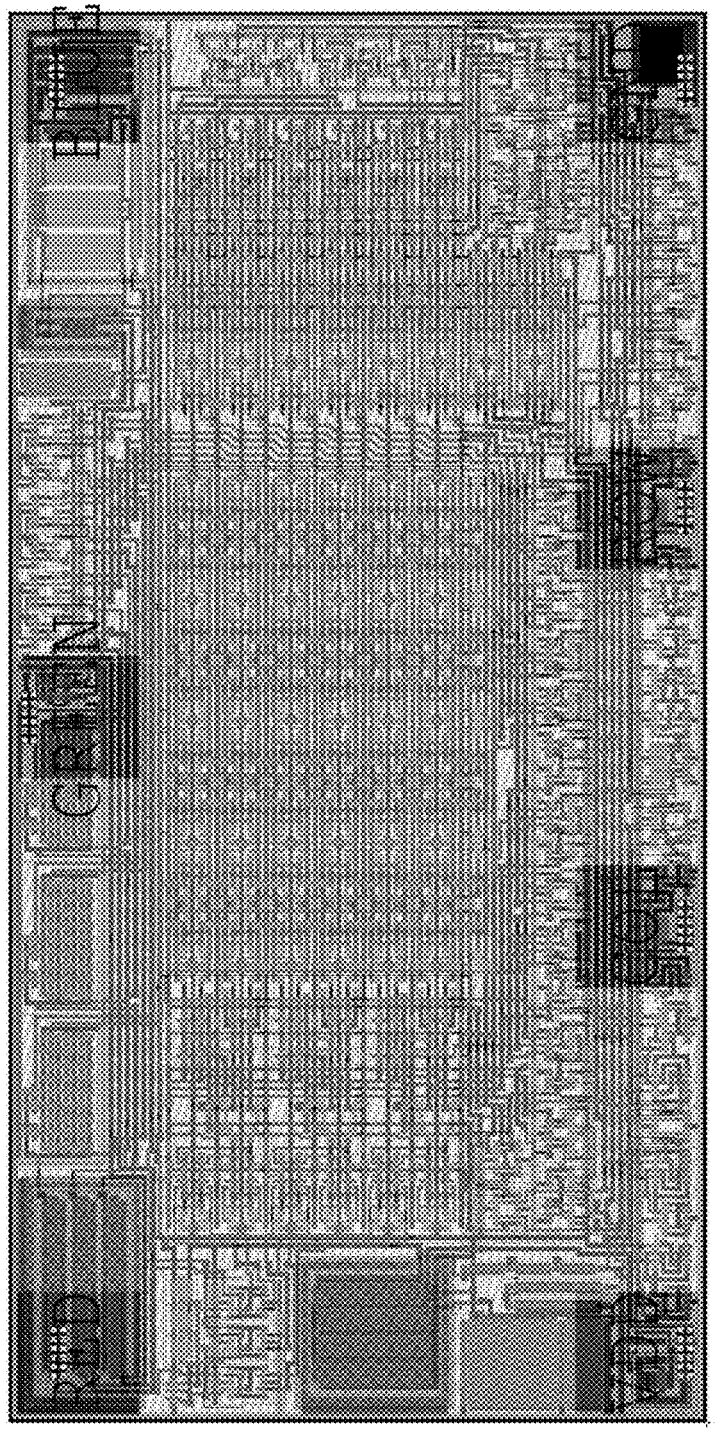
FIG. 12 is a layout diagram of a pixel-controller chiplet according to an embodiment of the present invention.
Figure 13:
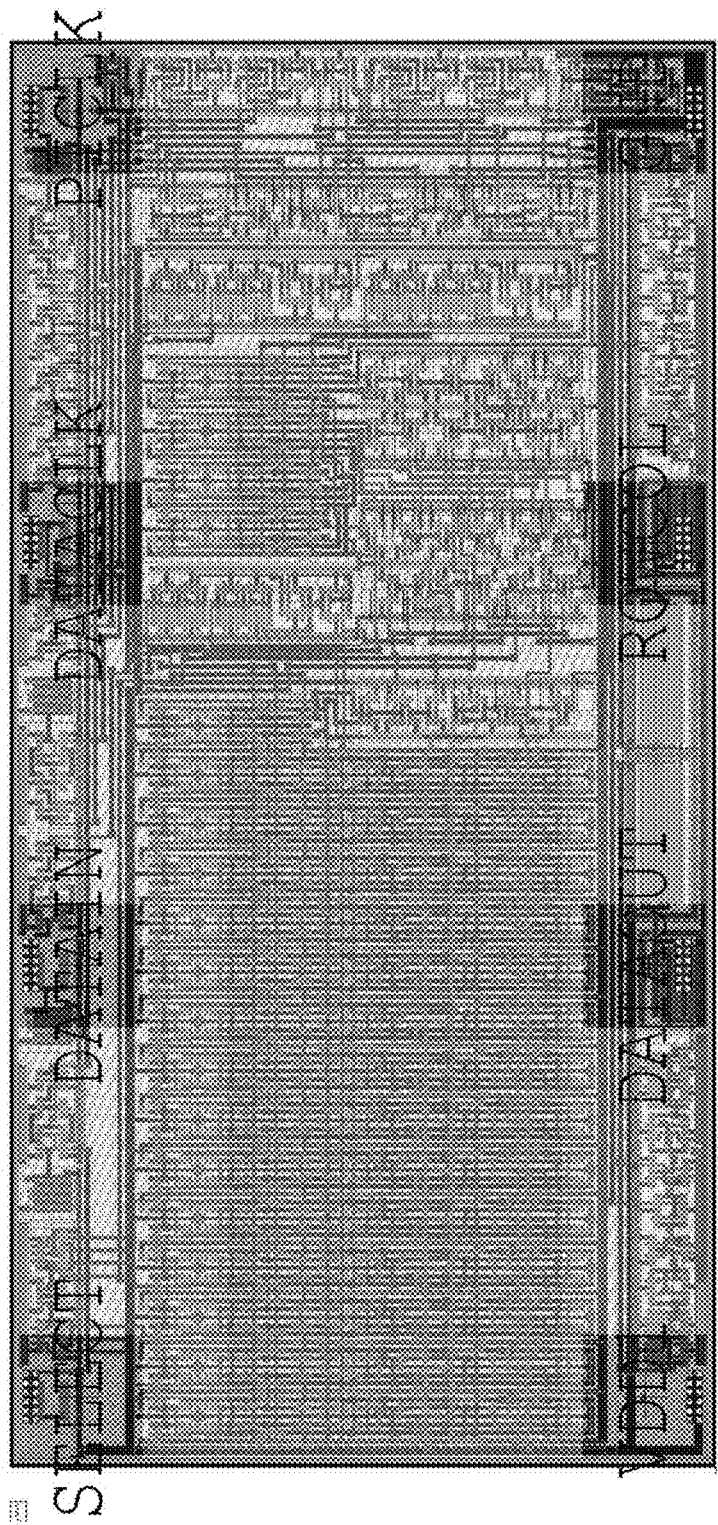
FIG. 13 is a layout diagram of a row-and-column-control chiplet according to an embodiment of the present invention.

FIG. 12 is a circuit layout of a pixel controller circuit according to an embodiment of the present invention and as illustrated in FIG. 2. FIG. 13 is a circuit layout of a row-controller chiplets 70A and column-data controller chiplets 72A according to an embodiment of the present invention and as illustrated in FIG. 4.

The array of display pixels 20 can be controlled through the row-select lines 60 and column-data lines 62 by a display controller 30. The display controller 30 can be one or more integrated circuits and can, for example, include an image frame store, digital logic, input and output data signal circuits, and input and output control signal circuits such as loading circuits 32, control circuits 34, and provide load timing signals, PWM timing signals, and column-data signals. Other control signals can also be provided. The loading circuit 32 can provide sequential rows of digital pixel values to corresponding selected rows of display pixels 20. The display controller 30 can include an image frame store memory for storing digital pixel and calibration values. The display controller 30 can have a display controller substrate 36 separate and distinct from the display substrate 50 that is mounted on the display substrate 50 or is separate from the display substrate 50 and connected to it by wires, for example with ribbon cables, flex connectors, or the like.

Figure 14:
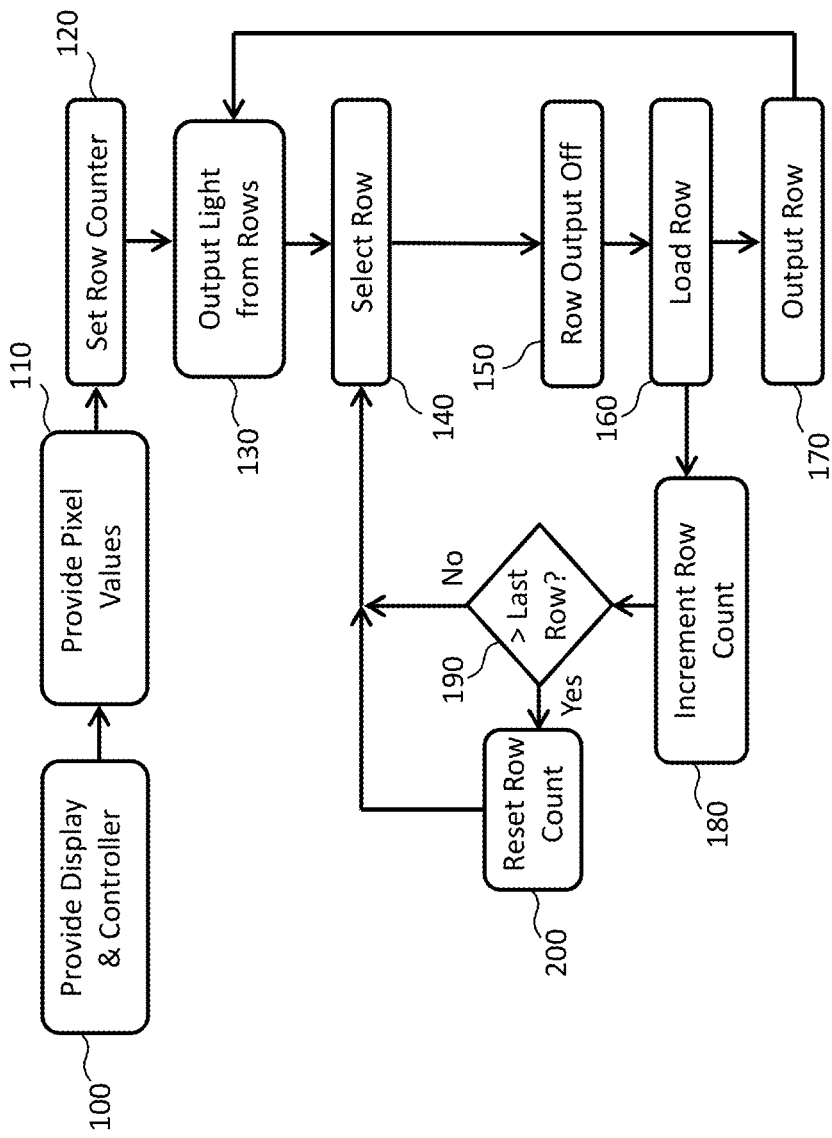
FIG. 14 is a flow diagram illustrating a method of the present invention.

Referring to FIG. 14, the digital-drive display system 10 of the present invention can be operated by first providing an array of display pixels 20 interconnected on a display substrate 50 connected to a display controller 30 in step 100. The display controller 30 receives an image having a multi-bit digital pixel value for each pixel 20 in the digital-drive display system 10 in step 110. A row counter is set in step 120. Multi-bit digital pixel values in the pixels 20 are output in step 130. A row of pixels 20 to be updated with multi-bit digital pixel values is selected in step 140 and output from the row turned off in step 150. The display controller 30 loads the digital pixel values into the serial digital memory 24 of the corresponding display pixel 20 using the loading circuit 32 and the control circuit 34 in step 160 during the load time period. Subsequent to loading the multi-bit digital pixel values into the pixels 20, in step 170 the drive circuit 26 of each display pixel 20 drives each light emitter 22 to emit light in response to the digital pixel value stored in the serial digital memory 24 during the output time period. At the same time, a row counter is incremented (or decremented or otherwise chosen to select the pixel row for loading) in step 180. If the last row of the pixel array is loaded (test step 190), the row counter is reset in step 200. The row counter is used to select the row in step 130 and the process repeats. While the selected row is being loaded, the remaining rows, as indicated in step 130, drive their output devices 22 with a PWM timing signal provided on each row of pixels 20.

Thus, the multi-bit digital pixel values from successive images can be loaded as successive frames in a sequence of image frames. In an embodiment, successive rows of multi-bit digital values are provided on the column-data lines and corresponding successive rows of pixels 20 are provided with a load timing signal. Each row of pixels 20 that is not being loaded can output corresponding to the multi-bit digital pixel values loaded in the multi-bit serial digital memory 24. The bits of each multi-bit digital pixel value are serially provided on the column-data lines 62 while the load timing signal is provided on the row-select lines 60 and serially loaded into the multi-bit digital serial digital memory 24 under the control of the state machine in the pixel controller 40. In an embodiment, the column-data controller chiplets 72A are double buffered single bit storage and drive circuits and the row-controller chiplet 70A generates a local row PWM timing signal.

The control signals for different rows of display pixels 20 can be out of phase to reduce the instantaneous current flow through the electrical connections on the display substrate 50 and to reduce synchronous flicker in the output devices 22. The PWM timing signal can be a digital signal provided by digital logic in the control circuit 34 of the display controller 30, or row controller 70, or row-controller chiplets 70A. Therefore, in an embodiment of the present invention, a pixel circuit for a digital-drive display system 10 includes a light emitter 22, a multi-bit serial digital memory 24 for storing multi-bit digital pixel value, circuits for receiving and applying a PWM timing signal, and a drive circuit 26 that drives the light emitter 22 when the serial digital memory 24 stores a non-zero digit value and the PWM timing signal is enabled. In an embodiment, a single row-select line 60 and a single column-data line 62 is provided to each pixel 20, and the pixel controller 40 decodes the load signal together with sequentially provided multi-bit data on the column-data line 62 to load the multi-bit digital pixel value into the multi-bit serial digital memory 24. The PWM timing signal then provides the timing necessary for the pixel controller 40 to output light from the light emitters 22. Since, in an active-matrix display, each row is loaded at a time, the PWM timing signal for each row can be separately provided, for example by the row controller 70 or row-controller chiplet 70A, and can be out of phase with PWM timing signals for other rows of pixels 20.

In an embodiment of the present invention, the multi-bit digital pixel value is a binary value, the digit places of the binary value correspond to powers of two, and the period of time corresponding to a digit place is equal to two raised to the power of the digit place minus one times a predetermined digit base period (($2^{**}$(digit place$-1$))*digit base period) and a frame period is equal to two raised to the power of the digit place times the predetermined digit base period (($2^{**}$(digit place))*digit period) times an integer greater than zero plus the load time period and any necessary control signaling. In various embodiments, the multi-bit digital pixel value is a 6-bit value, an 8-bit value, a 9-bit value, a 10-bit value, an 11-bit value, a 12-bit value, a 13-bit value, a 14-bit value, a 15-bit value, or a 16-bit value.

In a binary system with a four-digit value, therefore, the time period corresponding to the first bit place (the ones value) is one bit period (the base period), the period corresponding to the second bit place (the twos value) is two bit periods long, the period corresponding to the third bit place (the fours value) is four bit periods long, and the period corresponding to the fourth bit place (the eights value) is eight bit periods long. The bit periods increase by successive powers of two for successive bits in numbers with successively more bits, for example, 8, 9, 10, 11, 12, 13, 14, 15, and 16 bits.

In an embodiment, the duration of the different bits of the PWM signal does not correspond exactly to powers of two.

Instead, the duration corresponding to larger bit places is made longer or shorter than the corresponding power of two in order to adjust the increase in brightness, that is the controller 30 controls the PWM timing signal to control the gamma of the light emitted from the pixels 20. Since the eye does not respond linearly to increases in light exposure (for example responding logarithmically or by a power law), the length of time the bits control the output of the output device 22 can be increased or decreased, as desired, thereby reducing the amount of storage required in the multi-bit serial digital memory 24 and reducing the size of the circuitry in the pixel controller 40. Alternatively, additional bits can be provided to the multi-bit digital signal to increase the range of the multi-bit digital pixel values and output devices 22, at the cost of additional circuitry.

In embodiments of the present invention, the digital-drive display system 10 is a color display that displays color images having pixels 20 including different colors and a multi-bit digital pixel value for each color of each pixel 20 in the image. In such embodiments, each display pixel 20 in the array of display pixels 20 includes a color light emitter 22 for each of the different colors that emits light of the corresponding color, a multi-bit serial digital memory 24 for storing the multi-bit digital pixel value for each of the different colors, and a drive circuit 26 for each of the different colors that drives each color of light emitter 22 to emit light when the corresponding serial digital memory 24 stores a non-zero digit value and the PWM timing signal is enabled. In an embodiment, the different colors are at least red, green, and blue but are not limited to red, green, or blue. Primary and other colors can also or alternatively be included. A color digital-drive display system 10 having red, green, and blue colors is shown in FIGS. 1-4 having red light emitters 22R for emitting red light, green light emitters 22G for emitting green light, and blue light emitters 22B for emitting blue light.

Referring to the embodiment of FIG. 2, each display pixel 20 includes a serial digital memory 24 for each of the red, green, and blue digital pixel values, a drive circuit 26 that includes a bit-to-current converter that drives each of the red, green, and blue light emitters 22R, 22G, 22B with a constant pre-determined current for a time period in response to the corresponding red, green, and blue digital pixel values stored in the serial digital memories 24 and in response to the PWM timing signal. The red, green, and blue light emitters 22R, 22G, 22B can be micro LEDs, the digit memories can be SRAM or DRAM, and the pixel controller 40 can include logic circuits (for example AND circuits) that combine the digital PWM timing signal with the multi-bit digital pixel value in each serial digital memory 24 and includes drive transistors forming a constant current circuit that drives the light emitters 22 when the PWM timing signal is enabled and the digital pixel value (e.g., bit value) is non-zero. Serial digital memory 24 circuits and drive circuits 26 can be formed in semiconductors (e.g. CMOS in silicon). As shown in FIG. 2, bits of the serial digital memory 24 can be sequentially loaded in combination with an address provided by the state machine. In this embodiment, the red, green, and blue digit values can be sequentially shifted into the RAM.

If the image is a color image, the loading circuit 32 of the display controller 30 includes circuitry for serially shifting a digit of each multi-bit digital pixel value for each of the different colors into the multi-bit serial digital memories 24 of each display pixel 20. The multi-bit serial digital memory 24 can include a red, a green, and a blue memory, each memory storing a corresponding red, green, or blue multi-bit digital pixel value.

The bits of the multi-bit digital pixel value can be loaded in any order, so long as the time period for which the PWM timing signal is enabled corresponds to the bit place of the loaded digital value and the order in which it is read out of the multi-bit serial digital memory 24. In various embodiments, the loading circuit 32 includes circuitry for loading the different digits of the multi-bit digital pixel value in ascending or descending digit-place order, or, indeed, in any order, so long as the PWM timing signal is provided in a corresponding order that also matches the order of bits read from the multi-bit serial digital memory 24 controlled by the state machine. Thus, in an alternative, the bit-planes are loaded in a scrambled digit-place order that is neither ascending nor descending and the loading circuit 32 includes circuitry for loading the different digits of the multi-bit digital pixel value in a scrambled digit-place order that is neither ascending nor descending. This can help to reduce flicker. Different rows of pixels 20 can employ different bit and PWM time period orders.

The pixel controller 40 and the light emitters 22 can be made in one or more integrated circuits 80 having separate, independent, and distinct substrates from the display substrate 50. The pixel controller 40 and the light emitters 22 can be chiplets: small, unpackaged integrated circuits such as unpackaged dies interconnected with wires connected to contact pads on the chiplets. The chiplets can be disposed on an independent substrate, such as the display substrate 50 or on a pixel substrate 42. In an embodiment, the chiplets are made in or on a semiconductor wafer and have a semiconductor substrate. The display substrate 50 or the pixel substrate 42 includes glass, resin, polymer, plastic, or metal. Alternatively, the pixel substrate 42 is a semiconductor substrate and the serial digital memory 24 or the drive circuit 26 are formed in or on and are native to the pixel substrate 42. The light emitters 22 and the pixel controller 40 for one display pixel 20 or multiple display pixels 20 can be disposed on the pixel substrate 42 and the pixel substrate 42 are typically much smaller than the display substrate 50. Semiconductor materials (for example silicon or GaN) and processes for making small integrated circuits are well known in the integrated circuit arts. Likewise, backplane substrates and means for interconnecting integrated circuit elements on the backplane are well known in the printed circuit board arts. The chiplets (e.g., pixel controller 40, pixel substrate 42, or light-emitter substrates 28) can be applied to the display substrate 50 using micro transfer printing and can include broken or separated tethers 46.

The chiplets or pixel substrates 42 can have an area of 50 square microns, 100 square microns, 500 square microns, or 1 square mm and can be only a few microns thick, for example 5 microns, 10 microns, 20 microns, or 50 microns thick.

In a method of the present invention, the pixel controller 40 or the light emitters 22 on the display substrate 50 are micro-transfer printed onto the display substrate 50 and and electrically connected, for example using photolithographic materials and methods. In another method, the pixel controller 40 and light emitters 22 are disposed on the pixel substrate 42 and the pixel substrates 42 are disposed on the display substrate 50 using compound micro assembly structures and methods, for example as described in U.S. patent application Ser. No. 14/822,868, filed Sep. 25, 2014, entitled Compound Micro-Assembly Strategies and Devices. However, since the pixel substrates 42 are larger than the pixel controller 40 or light emitters 22, in another method of the present invention, the pixel substrates 42 are disposed on the display substrate 50 using pick-and-place methods found in the printed-circuit board industry, for example using vacuum grippers. The pixel substrates 42 can be interconnected with the display substrate 50 using photolithographic methods and materials or printed circuit board methods and materials. For clarity, the pixel substrate 42, pixel controller 40, and light emitter 22 electrical interconnections are omitted from FIG. 1.

In useful embodiments the display substrate 50 includes material, for example glass or plastic, different from a material in an integrated-circuit substrate, for example a semiconductor material such as silicon or GaN. The light emitters 22 can be formed separately on separate semiconductor substrates, assembled onto the pixel substrates 42 and then the assembled unit is located on the surface of the display substrate 50. This arrangement has the advantage that the display pixels 20 can be separately tested on the pixel substrate 42 and the pixel substrate 42 accepted, repaired, or discarded before the pixel substrate 42 is located on the display substrate 50, thus improving yields and reducing costs.

In an embodiment, the drive circuits 26 drive the light emitters 22 with a current-controlled drive signal. The drive circuits 26 can convert a digital display pixel value to a to a current drive signal, thus forming a bit-to-current converter. Current-drive circuits, such as current replicators, can be controlled with a pulse-width modulation scheme whose pulse width is determined by the digital bit value. A separate drive circuit 26 can be provided for each light emitter 22, or a common drive circuit 26, or a drive circuit 26 with some common components (e.g., a state-machine address generator) can be used to drive the light emitters 22 in response to the multi-bit digital pixel values stored in the serial digital memory 24. Power connections, ground connections, and clock signal connections can also be included in the pixel controller 40.

In embodiments of the present invention, providing the display controller 30, the light emitters 22, and the pixel controller 40 can include forming conductive wires on the display substrate 50 or pixel substrate 42 by using photolithographic and display substrate 50 processing techniques, for example photolithographic processes employing metal or metal oxide deposition using evaporation or sputtering, curable resin coatings (e.g. SU8), positive or negative photoresist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The electrical interconnections, or wires, on the pixel substrate 42 can be fine interconnections 66, for example having a width of less than 50 microns, less than 20 microns, less than 10 microns, less than five microns, less than two microns, or less than one micron. Such fine interconnections 66 are useful for interconnecting chiplets, for example as bare dies with contact pads and used with the pixel substrates 42. Alternatively, wires can include one or more coarse lithography interconnections having a width from 1 µm to 2 µm, 2 µm to 5 µm, 5 µm to 10 µm, 10 µm to 20 µm, 20 µm to 50 µm, 50 µm to 100 µm, 100 µm to 500 µm, or 500 µm to 2 mm, wherein each coarse lithography interconnection electrically connects the pixel substrates 42 to the display substrate 50 or forms wiring on the display substrate 50.

In an embodiment, the light emitters 22 (e.g. micro-LEDs) are micro-transfer printed to the pixel substrates 42 or the display substrate 50 in one or more transfers. For a discussion of micro-transfer printing techniques see, U.S. Pat. Nos. 8,722,458, 7,622,367 and 8,506,867, each of which is hereby incorporated in its entirety by reference. The transferred light emitters 22 are then interconnected, for example with conductive wires and optionally including connection pads and other electrical connection structures, to enable the display controller 30 to electrically interact with the light emitters 22 to emit light in the digital-drive display system 10 of the present invention. In an alternative process, the transfer of the light emitters 22 is performed before or after all of the conductive wires are in place. Thus, in embodiments the construction of the conductive wires can be performed before the light emitters 22 are printed or after the light emitters 22 are printed or both. In an embodiment, the display controller 30 is externally located (for example on printed circuit board substrate separate from the display substrate 50) and electrically connected to the display substrate 50 using connectors, ribbon cables, or the like. Alternatively, the display controller 30 is affixed to the display substrate 50 outside the substrate display area 52, for example using surface mount and soldering technology, and electrically connected to the pixels 20 using wires and buses 64 formed on the display substrate 50.

In an embodiment of the present invention, an array of display pixels 20 (e.g., as in FIG. 1) can include 40,000, 62,500, 100,000, 500,000, one million, two million, three million, six million, 24 million or more display pixels 20, for example for a quarter VGA, VGA, HD, 4k, or 8k display having various resolutions. In an embodiment of the present invention, the light emitters 22 can be considered integrated circuits 80, since they are formed in a substrate, for example a wafer substrate, using integrated-circuit processes.

The display substrate 50 usefully has two opposing smooth sides suitable for material deposition, photolithographic processing, or micro-transfer printing of micro-LEDs. The display substrate 50 can have a size of a conventional display, for example a rectangle with a diagonal of a few centimeters to one or more meters. The display substrate 50 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the light emitters 22 emit light through the display substrate 50. In other embodiments, the light emitters 22 emit light in a direction opposite the display substrate 50. The display substrate 50 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the display substrate 50 can include layers formed on an underlying structure or substrate, for example a rigid or flexible glass or plastic substrate.

In an embodiment, the display substrate 50 can have a single, connected, contiguous substrate display area 52 that includes the light emitters 22 and the light emitters 22 each have a light-emissive area 44 (FIG. 10). The combined light-emissive areas 44 of the plurality of light emitters 22 is less than or equal to one-quarter of the contiguous substrate display area 52. In further embodiments, the combined light-emissive areas 44 of the plurality of light emitters 22 is less than or equal to one eighth, one tenth, one twentieth, one fiftieth, one hundredth, one five-hundredth, one thousandth, one two-thousandth, or one ten-thousandth of the contiguous substrate display area 52. The light-emissive area 44 of the light emitters 22 can be only a portion of the light emitter 22. In a typical light-emitting diode, for example, not all of the semiconductor material in the light-emitting diode necessarily emits light. Therefore, in another embodiment, the light emitters 22 occupy less than one quarter of the substrate display area 52.

In an embodiment of the present invention, the light emitters 22 are micro-light-emitting diodes (micro-LEDs), for example having light-emissive areas 44 of less than 10, 20, 50, or 100 square microns. In other embodiments, the light emitters 22 have physical dimensions that are less than 100 µm, for example having a width from 2 to 5 µm, 5 to 10 µm, 10 to 20 µm, or 20 to 50 µm, having a length from 2 to 5 µm, 5 to 10 µm, 10 to 20 µm, or 20 to 50 µm, or having a height (thickness) from 2 to 5 µm, 4 to 10 µm, 10 to 20 µm, or 20 to 50 µm. The light emitters 22 can have a size of one square micron to 500 square microns. Such micro-LEDs have the advantage of a small light-emissive area 44 compared to their brightness as well as color purity providing highly saturated display colors and a substantially Lambertian emission providing a wide viewing angle.

According to various embodiments, the digital-drive display system 10, for example as used in a digital display of the present invention, includes a variety of designs having a variety of resolutions, light emitter 22 sizes, and displays having a range of substrate display areas 52. For example, substrate display areas 52 ranging from 1 cm by 1 cm to 10 m by 10 m in size are contemplated. In general, larger light emitters 22 are most useful with, but are not limited to, larger substrate display areas 52. The resolution of light emitters 22 over a display substrate 50 can also vary, for example from 50 light emitters 22 per inch to hundreds of light emitters 22 per inch, or even thousands of light emitters 22 per inch. For example, a three-color display can have one thousand 10µ× 10µ light emitters 22 per inch (on a 25-micron pitch). Thus, the present invention has application in both low-resolution and very high-resolution displays. An approximately one-inch 128-by-128 pixel display having 3.5 micron by 10-micron emitters has been constructed and successfully operated as described in U.S. patent application Ser. No. 14/743,981, filed Jun. 18, 2015, entitled Micro-Assembled Micro LED Displays and Lighting Elements.

As shown in FIG. 1, the display pixels 20 form a regular array on the display substrate 50. Alternatively, at least some of the display pixels 20 have an irregular arrangement on the display substrate 50.

In an embodiment, the chiplets or pixel substrate 42 are formed in substrates or on supports separate, independent, and distinct from the display substrate 50. For example, the light emitters 22 are separately formed in a semiconductor wafer. The light emitters 22 are then removed from the wafer and transferred, for example using micro transfer printing, to the display substrate 50 or pixel substrate 42. This arrangement has the advantage of using a crystalline semiconductor substrate that provides higher-performance integrated circuit components than can be made in the amorphous or poly-silicon semiconductor available on a large substrate such as the display substrate 50. By employing a multi-step transfer or assembly process, increased yields are achieved and thus reduced costs for the digital-drive display system 10 of the present invention. Additional details useful in understanding and performing aspects of the present invention are described in U.S. patent application Ser. No. 14/743,981, filed Jun. 18, 2015, entitled Micro-Assembled Micro LED Displays and Lighting Elements.

The present invention has been designed and laid out for a full-color active-matrix micro-LED display on a square glass or plastic display substrate 50. As shown in FIG. 12, a 40-micron by 81-micron chiplet includes the circuit illustrated in FIG. 2. The pixel controller 40 has seven connections: power, ground, red output, green output, blue output, row control, and column control. The array of display pixels 20 are controlled by a display controller 30 incorporating a field-programmable gate array (FPGA). The digital-drive display system 10 is driven by column-data controller chiplets 72A providing digital pixel values to each row of the array on column-data lines 62 and load and PWM timing signals from the row-controller chiplets 70A on row-select lines 60. The chiplets are formed in a silicon wafer and micro transfer printed to the display substrate 50. The row-controller chiplet 70A and column-data controller chiplet 72A are laid out in a semiconductor integrated circuit as illustrated in FIG. 13. The circuit of FIG. 13 implements both the row control (load and PWM timing functions) and column-data functions; the desired row or column function in the circuit of FIG. 13 is selectable by a control line set to a ground or power signal.

The present invention has been described with respect to a digital-drive display system 10 including pixels 20 and output devices 22 that emit light. However, the control structure and design of the display can be applied more generally to matrix-addressed systems with an output device that can output (or input) in different modalities, including light but also other types of energy. Thus, in an alternative embodiment of the present invention an active-matrix digital-drive system comprises an array of elements arranged in rows and columns. Each element has an output device 22, a serial digital memory 24 responsive to a load timing signal for receiving and storing a multi-bit digital element value during an uninterrupted load time period, and a drive circuit 26 responsive to a pulse-width-modulation (PWM) timing signal and to the multi-bit digital element value to drive the output device during an uninterrupted output time period subsequent to the load time period. A controller 30 external to the array of elements provides to each element the load timing signal and the multi-bit digital elements value during the load time period and the PWM timing signal during the output time period. The PWM timing signal has multiple different PWM time periods that are sequentially provided at different times to the elements, each PWM time period having a different temporal length corresponding to a bit of the multi-bit digital element value. The different attributes, designs, structure, and operation described above are also applicable to the more general system embodiment.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Furthermore, the terms "row" and "column" are arbitrary designations and can be exchanged in embodiments of the present invention.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST $D_1$ distance between pixels
$D_2$ distance between pixel components
10 digital-drive display system
20 pixel/display pixel
22 output device/light emitter
22R red light emitter
22G green light emitter
22B blue light emitter
24 multi-bit serial digital memory
26 drive circuit
28 light-emitter substrate
30 controller/display controller
32 loading circuit
34 control circuit
36 display controller substrate
40 pixel controller
42 pixel substrate
44 light-emissive area
46 tether
50 display substrate
52 substrate display area
60 row-select line
62 column-data line
64 bus
66 fine interconnection
70 row controller
70A row-controller chiplet
72 column-data controller
72A column-data controller chiplet
80 integrated circuit
100 provide display and controller step
110 provide pixel values step
120 set row counter step
130 output light from rows step
140 select row step
150 turn off selected row output step
160 load row step
170 output row step
180 increment row count step
190 test row count step
200 reset row count step

What is claimed is:

1. An active-matrix digital PWM display having a display area, comprising:

an array of pixels forming rows and columns disposed in the display area, each pixel comprising two or more output devices that are each operable to output a different color of light, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the two or more output devices during an uninterrupted output time period subsequent to the load time period;

an array of row-select lines, each row-select line connected in common to a different row of pixels;

an array of column-data lines connected in common to each column of pixels; and an array of row controllers each serially connected to another of the row controllers, the row controllers having separate, independent and distinct substrates external to the array of pixels, each row controller connected to each pixel in a row of pixels and providing in common to each pixel in the row the load timing signal during the load time period and the PWM timing signal during the output time period, wherein the PWM timing signal has multiple different PWM time periods that are sequentially provided at different times to the pixels, each timing period having a different temporal length corresponding to a different bit of the multi-bit digital pixel value, wherein each row controller provides an output time period for each output device that is greater than or equal to twice the entire duration of the PWM timing signal for all of the bits combined in each entire multi-bit digital pixel value.

2. The digital PWM display of claim 1, wherein the one or more output devices are each a light-emitter, light-controller, a light-emitting diode, or an inorganic light-emitting diode that emits light.

3. The digital PWM display of claim 1, wherein the serial digital memory and drive circuit of each pixel is provided in a single pixel-control integrated circuit having a separate, independent, and distinct substrate and a broken or separated tether and the output device is provided in an integrated circuit having a substrate separate, independent, and distinct from the pixel-control integrated circuit and a broken or separated tether.

4. The active-matrix digital PWM display of claim 3, wherein the pixel-control integrated circuit is disposed on the pixel substrate.

5. The digital PWM display of claim 1, wherein the serial digital memory stores three independent multi-bit digital pixel values and each pixel has three output devices and three drive circuits responsive to the same PWM timing signal at the same time, each of the three output devices responsive to a different one of the three multi-bit digital pixel values stored in the serial digital memory.

6. The digital PWM display of claim 5, wherein the serial digital memory and the three drive circuits of each pixel are provided in a single pixel-control integrated circuit having a separate, independent, and distinct substrate and a broken or separated tether and the output devices are each provided in an integrated circuit having a substrate separate, independent, and distinct from the pixel-control integrated circuit and a broken or separated tether.

7. The digital PWM display of claim 1, wherein the controller provides a load timing signal and a PWM timing signal to all of the pixels in a row.

8. The digital PWM display of claim 1, wherein the pixels are controlled by only two control wires, exclusive of any power or ground connections.

9. The digital PWM display of claim 1, wherein the output time period for each output device is greater than or equal to twice the entire duration of the PWM timing signal for each entire multi-bit digital pixel value.

10. The active-matrix digital PWM display of claim 1, comprising column drivers having separate, independent and distinct substrates, each column driver connected to a column-data line, the column drivers sequentially providing the bits of the multi-bit digital pixel values, and the row controllers and the column drivers each having a broken or separated tether.

11. The active-matrix digital PWM display of claim 10, wherein the row controller provides a load timing signal to the row-select lines in conjunction with the column driver sequentially providing the bits of the multi-bit digital pixel values on the column-data lines.

12. The active-matrix digital PWM display of claim 10, wherein the column drivers are serially connected.

13. The active-matrix digital PWM display of claim 10, wherein each column driver applies PWM timing signals to a column of pixels, and wherein the PWM time periods provided to at least one column of pixels are ordered differently from or are temporally out of phase with the PWM time periods of another, different column of pixels.

14. The active-matrix digital PWM display of claim 11, wherein a first row controller provides a load timing signal to a first row of pixels at the same time as a second row controller different from the first row controller provides a PWM timing signal to a second row of pixels different from the first row.

15. The active-matrix digital PWM display of claim 1, comprising a pixel-control integrated circuit including the serial digital memory disposed on the pixel substrate.

16. The active-matrix digital PWM display of claim 15, wherein the pixel-control integrated circuit is a bare die.

17. The active-matrix digital PWM display of claim 1, wherein each row controller independently provides a load timing signal and a PWM timing signal to all of the pixels in a row.

18. The active-matrix digital PWM display of claim 1, wherein each of the serially connected row controllers has a separate, independent and distinct substrate and is connected to a row of pixels.

19. The active-matrix digital PWM display of claim 1, wherein each serially connected row controller applies PWM timing signals to a row of pixels, and wherein the PWM time periods provided to at least one row of pixels are ordered differently from or are temporally out of phase with the PWM time periods of another, different row of pixels.

20. The active-matrix digital PWM display of claim 1, comprising a display substrate and wherein the pixels are spatially distributed over the display substrate and are separated by a distance greater than the distance between any of the output device, serial digital memory, and drive circuit of a pixel.

21. A method of controlling an active-matrix digital PWM display, comprising:
providing an active-matrix digital PWM display having a display area, wherein the PWM display comprises
an array of pixels forming rows and columns disposed in the display area, each pixel comprising two or more output devices that are each operable to output a different color of light, a serial digital memory responsive to a load timing signal for receiving and storing a multi-bit digital pixel value during an uninterrupted load time period, and a drive circuit responsive to a pulse-width-modulation (PWM) timing signal and to the multi-bit digital pixel value to drive the two or more output devices during an uninterrupted output time period subsequent to the load time period,
an array of row-select lines, each row-select line connected in common to a different row of pixels,
an array of column-data lines connected in common to each column of pixels, and
an array of row controllers each serially connected to another of the row controllers, the row controllers having separate, independent and distinct substrates external to the array of pixels, each row controller connected to each pixel in a row of pixels and providing in common to each pixel in the row the load timing signal during the load time period and the PWM timing signal during the output time period, wherein
the PWM timing signal has multiple different PWM time periods that are sequentially provided at different times to the pixels, each timing period having a different temporal length corresponding to a different bit of the multi-bit digital pixel value, wherein each row controller provides an output time period for each output device that is greater than or equal to twice the entire duration of the PWM timing signal for all of the bits combined in each entire multi-bit digital pixel value;
providing an array of multi-bit digital pixel values having rows and columns of multi-bit digital pixel values corresponding to the rows and columns of pixels in the array of pixels;
providing a load signal on the row-select line of a row of pixels with the row controller connected to the row-select line and, at the same time, sequentially providing the bits of the corresponding multi-bit digital pixel values to the column-data lines during a load time period; and
subsequent to the load time period, providing a PWM timing signal one or more times to the row-select line during the output time period.

* * * * *